United States Patent [19]
Aoki et al.

[11] Patent Number: 5,676,760
[45] Date of Patent: Oct. 14, 1997

[54] METHOD FOR WET PROCESSING OF A SEMICONDUCTOR SUBSTRATE

[75] Inventors: Hidemitsu Aoki; Makoto Morita; Mikio Tsuji, all of Tokyo, Japan

[73] Assignee: NEC Corporation, Tokyo, Japan

[21] Appl. No.: 408,082

[22] Filed: Mar. 23, 1995

[30] Foreign Application Priority Data

Mar. 25, 1994 [JP] Japan ................................ 6-056109

[51] Int. Cl.$^6$ .................................................. B08B 7/00
[52] U.S. Cl. .................................................. 134/1.3
[58] Field of Search ................... 134/2, 1.3, 3; 204/130, 204/149; 205/766, 769, 770, 742, 674, 656

[56] References Cited

U.S. PATENT DOCUMENTS

| | | | |
|---|---|---|---|
| 3,959,098 | 5/1976 | Schwartz | 205/656 |
| 5,097,130 | 3/1992 | Koashi | 250/339 |
| 5,290,361 | 3/1994 | Hayashida | 134/2 |
| 5,409,569 | 4/1995 | Seki | 216/99 |

FOREIGN PATENT DOCUMENTS

| | | |
|---|---|---|
| 0 605 882 | 7/1994 | European Pat. Off. . |
| 204132 | 12/1982 | Japan . |
| 61-14232 | 1/1986 | Japan . |
| 61-14233 | 1/1986 | Japan . |
| 41770 | 2/1994 | Japan . |
| 6-260480 | 9/1994 | Japan . |

OTHER PUBLICATIONS

"A Cleaning Method Utilizing Red/Ox Procedures—A New Cleaning Method in Electronics Industry" *The Journal for Cleaning Design* by Sumita et al., spring issue of 1987, no month available.

"A New Science of Water and Application Technologies", by Sumita, pp. 190–207 (Aug. 1992).

*Primary Examiner*—John Niebling
*Assistant Examiner*—Brendan Mee
*Attorney, Agent, or Firm*—Young & Thompson

[57] ABSTRACT

Electrolyzed waters, including an anode water and a cathode water, having either oxidizing or reducing activity and having either acidity or alkalescency, which is obtained by electrolysis of an aqueous solution prepared by addition of a minute amount of electrolytes, is applied wet processings including cleaning, etching and rinsing processings of semiconductor wafers. The effects of the electrolyzed waters are not lower than those the conventional acidic or alkalic chemicals provide, and remarkably reduces quantity of chemicals used in wet processings in semiconductor manufacturing.

13 Claims, 16 Drawing Sheets

METHOD FOR WET PROCESSING OF A SEMICONDUCTOR SUBSTRATE

BACKGROUND OF THE INVENTION (a) Field of the Invention

The present invention relates to a method for wet processing of a semiconductor substrate and, more particularly, to a new method for wet processing of a semiconductor substrate capable of reducing amount of chemicals used in cleaning, etching or rinsing steps in manufacturing semiconductor devices.

(b) Description of the Related Art

The semiconductor industry which supports the dissemination of information to society has a serious problem to be solved at any cost. It is reducting the amount of chemicals which are consumed In great quantity during manufacturing processes of semiconductor devices. A volume reduction in the consumption of chemicals is critical not only from the pollution problem point of view, but also from the treatment fee reduction of waste chemicals. This is particularly true when considering the scale and the promising future of the electronics industry, although they do not consume as much chemicals as do the so-called heavy industries. The present invention is directed to reducing the volume of chemicals wasted in so-called wet processings for manufacturing semiconductor devices such as cleaning, etching or rinsing processes.

There exist many so-called wet processing steps for manufacturing semiconductor devices, such as cleaning, etching and rinsing. Even if confined to steps conducted by semiconductor substrate manufacturers, after a step for pulling-up single crystals, the wet processes extend to cleaning processes. These include slicing, mechanical lapping and chemi-mechanical polishing steps by employing organic chemicals, a cleaning process for removing sludges generated in the mechanical lapping step, etching processes employing strong acids and alkalis, and chemi-mechanical polishing process; which consumes vast volume of chemicals.

Furthermore, after the wafers are shipped to manufactures of semiconductors, the wet processes begin with a, so called Dr. Branson or RCA Cleaning conducted for wafer surfaces before starting manufacturing steps. The wet processes then extend to photoresist processes in the multiple photoengraving steps and to acid or alkali etching processes employing vast volume of chemicals in steps for selectively etching oxide or metallic films.

The many species of wet processes for cleaning, etching and rinsing the semiconductor wafers mentioned above are classified into a process for etch-removing the semiconductor surfaces, a process for removing metallic contaminants, organic particles, photoresist residues and ionic residuals adhered onto the surface substantially without etching off any underlying semiconductors, metals and insulators, and a process for etch-removing natural oxide films and organic films adhered onto the underlying semiconductors, metallic and organic Films etc.

Some of the wet processings which have been used are tabulated in Table 1.

Table 1

| Treatment | Chemicals (Composition) | Effect/Etch Rate |
|---|---|---|
| Etch | | |
| Si | Alkali Solu. (KOH, Choline) | 40–100 A/min |
| Si | APM ($NH_4OH:H_2O_2:H_2O$ = 1:4:20) | 2–10 A/min |
| Compound | SPM ($H_2SO_4:H_2O$ = 5:1) | 50–1000 A/min |
| Metal | dil. HCl aq. | 0.1–1.0 μm/min |
| Insulator($SiO_2$) | DHF ($HF:H_2O$ = 1:50–400) | 10–500 A/min |
| Remove on Si | | |
| Metal | SPM ($H_2SO_4:H_2O$ = 5:1) | <$10^{10}$ atom/$cm^2$ |
| Metal | HPM ($HCl:H_2O_2*H_2O$ = 1:1:6) | <$10^{10}$ atom/$cm^2$ |
| Organic | APM ($NH_4OH:H_2O_2:H_2O$ = 1:4:20) | <100 pcs/wafer |
| Organic | SPM ($H_2SO_4:H_2O$= 5:1) | <100 pcs/wafer |
| Inorganic Part. | APM ($NH_4OH:H_2O_2:H_2O$ = 1:4:20) | <100 pcs/wafer |
| Remove | | |
| Metal Contami. | HPM ($CHl:H_2O_2*H_2O$ = 1:1:6) | <$10^{10}$ atom/$cm^2$ |
| Org./Inorganics | APM ($NH_4OH:H_2O_2:H_2O$ = 1:4:20) | <100 pcs/wafer |
| Remove | | |
| Metal | SPM ($H_2SO_2:H_2O$ = 5:1) | <$10^{10}$ atom/$cm^2$ |
| Metal | HPM ($HCl:H_2O_2*H_2O$ = 1:1:6) | <$10^{10}$ atom/$cm^2$ |
| Metal | $HNO_3$ | <$10^{10}$ atom/$cm^2$ |
| Organics | APM ($NH_4OH:H_2O_2:H_2O$ = 1:4:20) | <100 pcs/wafer |
| Organics | SPM ($H_2SO_4:H_2O$ = 5:1) | <100 pcs/wafer |
| Inorganics | APM ($NH_4OH:H_2O_2:H_2O$ = 1:4:20) | <100 pcs/wafer |
| Remove Natural Oxide Film On Si | DHF ($HF:H_2O$ = 1:50–400) | |

It is described in "A Cleaning Method Utilizing Red/Ox Procedures—A New Cleaning Method in Electronics Industry" written by Sumita et al. on "The Journal for Cleaning Design" published by Kindai Hensyu-sha, Spring Issue of 1987 (referred to as "Ref. 1" hereinafter) that electrolyzed water has special activities. A step for electrolyzing water is illustrated in a schematic view of Ref. 1 (FIG. 2) wherein two electrodes 103 and 104 are installed in a water bath 101 and separated from each other by ion-exchange film 102. An electrolyzing reaction is effected by applying a DC voltage between two electrodes, with electrode 103 being an anode and electrode 104 being a cathode. It is recited that the water formed on the anode side (referred to as "an anode water" hereinafter) exhibits acidity because of an increase in $H^+$ ions, while the water formed on the cathode side (referred to as "a cathode water" hereinafter) exhibits alkalinity because of an increase in $OH^-$ ions.

Various conditions and situations are investigated to apply the electrolyzed waters to wet processing steps in manufacturing semiconductor devices. According to Ref. 1, it is reported that two species of waters which generate in anode and cathode chambers, respectively, by electrolysis of de-ionized water have special activities including cleaning effects, beside different oxidation/reduction potentials (referred to as "ORP" hereinafter) and different pH values which indicate extent of their acidity and alkalinity as compared to ordinary de-ionized water. Accordingly, cleaning, etching and rinsing effects off the waters, which are prepared in the cathode and anode chambers by the method according to Ref. 1, are re-examined for application to steps in manufacturing semiconductor devices.

Unfortunately, the specific effects which are peculiar to the waters according to Ref. 1 are, however, not re-confirmed in our experiments, although there is a little suspicion that the method according to Ref. 1 was not strictly adhered to in our experiments. Then, the electrolyzed waters provided by duplicating the method according to Ref. 1 are directed to application to steps in manufacturing semiconductor devices on the condition that a minute amount of chemicals is added to the de-ionized water, thereby compromising the initial principle that any amount of chemicals should not be utilized during wet processing. Ref. 1 does recite electrolyzing electrolytic solutions, but does not recite any concrete species of the electrolytes.

We have disclosed methods applied to steps for manufacturing semiconductor devices in JP Patent Application No. 5(1993)-105991. In JP Patent Application No. 5(1993) -105991, an apparatus for forming electrolyzed water illustrated in FIG. 3 of the present application has been proposed, wherein it is demonstrated in embodiments that the addition of a minute amount of quaternary alkyl ammonium combined with cations except for halogen ions into deionized water 201 is useful for electrolyzing of water. Addition of the specified chemicals verified that the electrolyzed water is applicable to wet processing steps in manufacturing semiconductor devices. The apparatus shown in FIG. 3 enables a precise pH control, because pH control system 205 controls pH through feedback of pH values measured by sensors 204a and 204b for generated anode and cathode waters, to an electrolyte addition quantity control system 202.

Those methods as described above have effects on some limited parts of semiconductor wet processings. However, it has been found that application to more universal processings (not only to cleaning but also to etching and rinsing processings) requires considerations of the conditions of electrolyzed waters and of cleaning procedures necessary for respective processes, especially of the ORP value, which is an indicator of the oxidizing/reduction ability of water, of resolved quantities of $O_3$ and $H_2$ gases and of oxoacid quantity of halogen. Experimental trails are required for achieving a reduction in the consumption of chemicals in all semiconductor processings and in the cost of treating waste liquids. Namely, the object of reducing an environmental load in semiconductor processings is an urgent problem that should be solved immediately.

SUMMARY OF THE INVENTION

In view of foregoing, it is an object to provide a new method for wet processing of semiconductor substrate capable of reducing the amount of chemicals consumed in the processing.

The present invention is directed to a method for processing a semiconductor wafer including steps of: adding at least one of electrolyte selected from the group consisting of ammonium chloride, ammonium acetate, ammonium fluoride, ammonium nitrate, ammonium bromide, ammonium iodide, ammonium sulfate, ammonium oxalate, ammonium carbonate, ammonium citrate, ammonium formate, hydrochloric acid and aqueous ammonia at a rate ranging from $8\times10^{-2}$ to $2\times10^{-5}$ mol/l into de-ionized water to prepare an aqueous solution; electrolyzing the aqueous solution to prepare an anode and a cathode waters in the vicinity of the anode and cathode electrodes; dipping at least a region to be processed of a semiconductor wafer into an aqueous solution (referred to as a processing solution) Including at least one of the anode and cathode waters or pouring the processing solution onto the region to be processed of the semiconductor wafer.

The present invention is further directed to a method for processing a surface of a semiconductor wafer in a processing solution prepared by addition of at least one acid selected from the group consisting of chelating agents, hydrochloric acid, formic acid and nitric acid, into an anode water which is prepared by electrolyzing water, at a rate ranging from $10^{-2}$ to $10^{-4}$ mol/l. More particularly, the method involves: adding at least one electrolyte selected from the group consisting of the electrolytes as recited above into water at a concentration ranging from $8\times10^{-2}$ to $2\times10^{-5}$ mol/l to prepare an aqueous solution; electrolyzing the aqueous solution to prepare an anode water; adding at least one acid selected from the group consisting of chelating agents, hydrochloric acid, formic acid and nitric acid into the anode solution at a molar concentration of the acid ranging from $10^{-2}$ to $10^{-4}$ to prepare a processing solution; and dipping a region to be processed of a semiconductor wafer into the processing solution or pouring the processing solution onto the region to be processed.

Moreover, the present invention is directed to a method for processing a semiconductor wafer including steps of: adding at least one electrolyte selected from the group consisting of the electrolytes as recited above into water at a concentration ranging from $8\times10^{-2}$ to $2\times10^{-5}$ mol/l to prepare an aqueous solution; electrolyzing the aqueous solution to prepare an anode water; adding at least one of chemical species consisting of hydrofluoric acid and ammonium fluoride at a rate providing a molar concentration ranging from $1/10$ to $1/500$ off the molar concentration of the electrolyte into the anode water to obtain a processing solution; dipping a region to be processed of a semiconductor wafer into the processing solution or pouring the processing solution onto the region to be processed.

Furthermore, the present invention is directed to a method for processing a semiconductor wafer including a step of: dipping a region to be processed of the semiconductor wafer into one of processing solutions including a first processing solution obtained by adding $H_2O_2$ into a cathode water, which is prepared by addition of at least one electrolyte selected from the group consisting of the electrolytes as recited above at a concentration ranging from $8\times10^{-2}$ to $2\times10^{-5}$ mol/l, in a quantity ranging between a value substantially equal to as the quantity of electrolyte added and a tenth thereof, a second processing solution containing oxoacid ions of chlorine, bromine or iodine at a concentration greater than $10^{-3}$ mol/l, a third processing solution prepared by bubbling the anode water as recited above with $Cl_2$, $Br_2$ and $I_2$ gases or $O_3$ gas, or pouring one of the processing solutions onto the region to be processed of the semiconductor wafer.

Furthermore, the present invention is directed to a method for processing a semiconductor wafer including dipping a region to be processed of the wafer into a processing solution prepared by bubbling the cathode water as recited above with $H_2$ gas or pouring the processing solution onto the region to be processed.

BRIEF DESCRIPTION OF THE DRAWINGS

The above and other objects, features and advantages of the present invention will be more apparent from the following description, taken in conjunction with the accompanying drawings in which.

PREFERRED EMBODIMENTS

Figure 4:
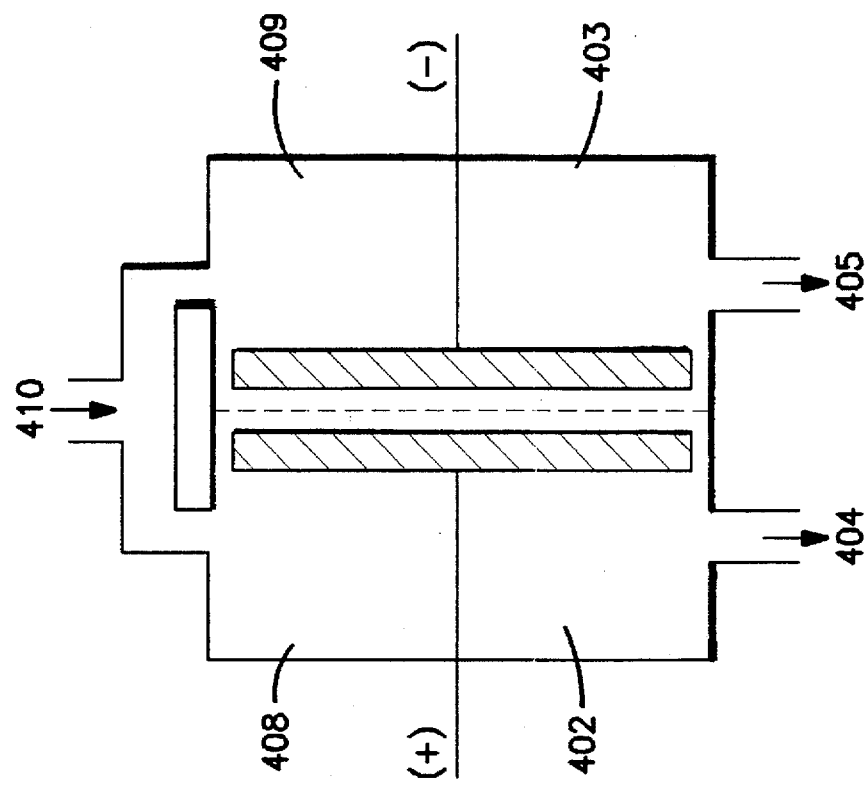
FIG. 4 is a schematic drawing showing a two-chamber type electrolytic bath used for preparing electrolyzed waters used in to the present invention.
Figure 2:
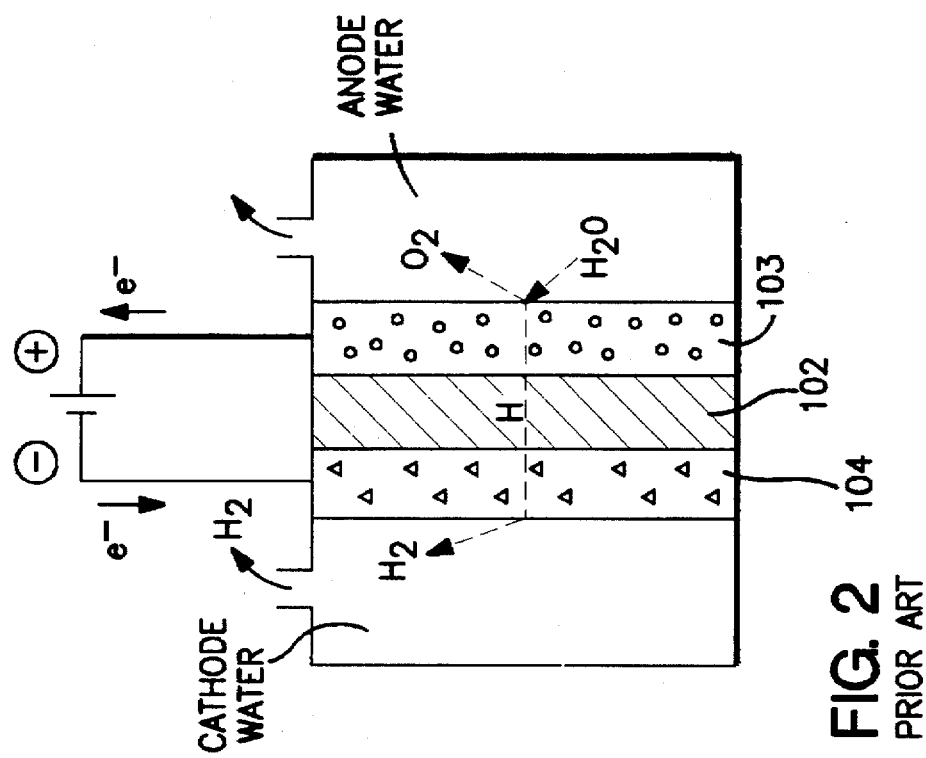
FIG. 2 is a schematic drawing showing a two-chamber type electrolytic bath used for producing conventionally electrolyzed water.
Figure 3:
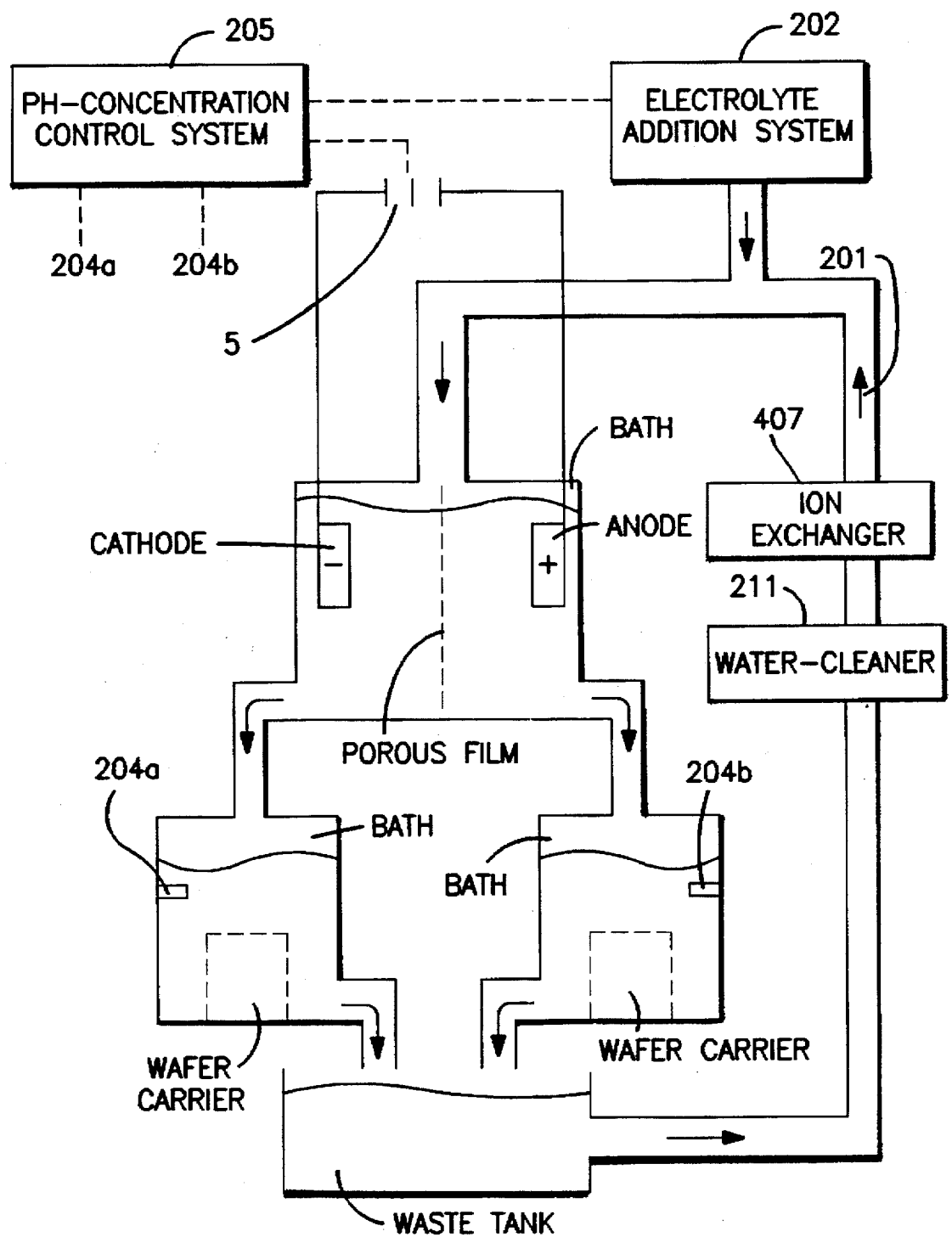
FIG. 3 is a schematic drawing illustrating conventional equipment for generating electrolyzed water.

A method for producing electrolyzed water will be described first. It is described, for instance, in A Handbook for the Electrochemistry, 4th Press published in 1985, P. 277 that there exist two types of electrolyzing systems for producing electrolyzed water, a two-chamber electrolyzing system which is used for general purpose use and a three-chamber electrolyzing system which is capable of electrolyzing even de-ionized water. Here, the two-chamber electrolyzing system is detailed with reference to a schematic drawing of electrolytic bath shown in FIG. 4. FIG. 4 is basically identical to the figure shown in JP Patent Application No. 5(1993)-105991. An aqueous solution 410 added with a minute amount of supporting salts is transported from a reservoir (not shown in FIG. 4) into an electrolytic bath. An anode 402 and a cathode 403 are installed in corresponding one of chambers 408 and 409 of the electrolytic bath, being separated from each other by an ion exchange film (a cationic membrane) made of fluorinated compounds. The distance between the anode 402 and cathode 403 installed in each of the chambers 408 and 409 separated by the ion exchange film is less than 1 cm. A DC voltage (2–50 V/cm) is applied therebetween. Some species of supporting electrolytes which have scarcely any ill-effect on semiconductor device characteristics are included in the aqueous solution 410 at a minute amount ($8 \times 10^{-2}$–$2 \times 10^{-5}$ mol/l) to raise an electrolyzing efficiency of de-ionized water. Addition of those electrolytes in a minute amount remarkably increases electric conductivity of the aqueous solution 410 and is important for raising the electrolyzing efficiency.

It is considered that the electrolytes to be added into the aqueous solution should not include any metal because the semiconductor wet processings are ill-affected by any metallic contamination. It is found that ammonium chloride, ammonium acetate, ammonium fluoride, ammonium nitrate, ammonium bromide, ammonia iodide, ammonium sulfate, ammonium oxalate, ammonium carbonate, ammonium citrate, ammonium formate, hydrochloric acid and aqueous ammonia are valid as electrolytes used for this purpose, which will be described in detail later by citing practical embodiments of semiconductor wet processings. Similarly, combination of an adequate selection and an adequate mixing of the recited electrolytes will be presented later in accordance with the process as desired.

As shown in FIG. 4, the two-chamber electrolyzing system employed by us has two chambers 408 and 409 separated by an ion exchange film 407 and Pt electrodes 402 and 403 allocated to respective chambers 408 and 409, Pt electrodes 402 and 403 scarcely exhibiting chemical reactions with the electrolyzed waters as produced inside the chambers 408 and 409. Carbon, especially glassy carbon or $RuO_2$ may be used as electrode materials instead of Pt. It is unnecessary to apply an identical material to an anode and a cathode electrodes. It is allowable, for instance, to select Pt as a material for the anode electrode 402 which is immersed in an acidic solution while carbon as a material for the cathode electrode 403 which is immersed in an alkaline solution.

To utilize electrolyzed waters, a DC voltage is applied between the electrodes 402 and 403 so that hydrogen gas and oxygen gas are produced in the cathode chamber 409 and anode chamber 408, respectively, and liquids extracted from two chambers 408 and 409 are independently collected. The DC voltage applied ranges from about 2 to about 50 V depending on the concentration of the electrolyte added into the de-ionized water and on the initial condition for electrolysis.

When electrolysis starts, $H^+$ ions are attracted to the cathode 403 and accept electrons From the cathode to liberate $H_2$ gas in the cathode chamber 409, resulting in an accumulation of $OH^-$ ions in accordance with reduction in number of $H^+$ ions. Accordingly, the cathode water 405 staying in and flowing from the cathode chamber 409 exhibits alkalinity and has a reducing activity due to the presence of hydroxyl ions generated from the cathode 403. Due to a similar reason, $OH^-$ ions are attracted to the anode electrode 402 and electrons are peeled-off in the anode chamber 408 by the anode electrode 402 to liberate $O_2$ gas in the anode chamber 408. Accordingly, the anode water 404 staying in and flowing from the anode chamber 408 exhibits acidity due to the presence of excess $H^+$ ions in accordance with reduction in $OH^-$ ions. Moreover, the anode water 404 has an oxidizing activity due to the generation of $O_2$ and $O_3$ gases. When an aqueous solution 410 containing the electrolytes recited in the present invention is electrolyzed, the $O_3$ quantity especially increases as compared with the case when no electrolyte is added. On the other hand, when halogen is added as the electrolyte, oxoacids (if the halogen atom is chlorine, it will be HClO, $HClO_2$, $HClO_3$ etc.) is formed and the oxidizing activity thereof is more remarkable.

Next, an embodiment of the present invention will be described wherein electrolyzed waters are applied to concrete semiconductor wet processings. Here, the pH and ORP (oxidizing/reducing potentials) values which will be cited in the following embodiments are defined. The pH values as recited in the present invention are measured on the basis of electrochemical procedures by employing a pH meter available in the market, not measured by litmus papers. As shown in "A New Science of Water and Application Technologies", P. 193 presented by Mr. Sumita, pH values differ significantly between values measured by pH meters and those by litmus papers. An experiment performed in the present invention indicated that an anode water and a cathode water exhibiting 2 and 9.5 in pH value, respectively, when measured by a pH meter, exhibited 4 and 7.5 in pH value, respectively, when measured by litmus papers. Although sufficient theoretical reason why the difference arises has not yet been found, the pH values recited hereinafter are represented in terms of values measured by a pH meter because the pH values which indicate one aspect of characteristics of electrolyzed waters vary significantly when measured on the basis of electrochemical procedures. The ORP values are measured by employing silver/silver chloride electrodes. Incidentally, it is well known that silver chloride electrode provides about +220 mV higher values as compared with those measured on the basis of a standard electrode.

Figure 5:
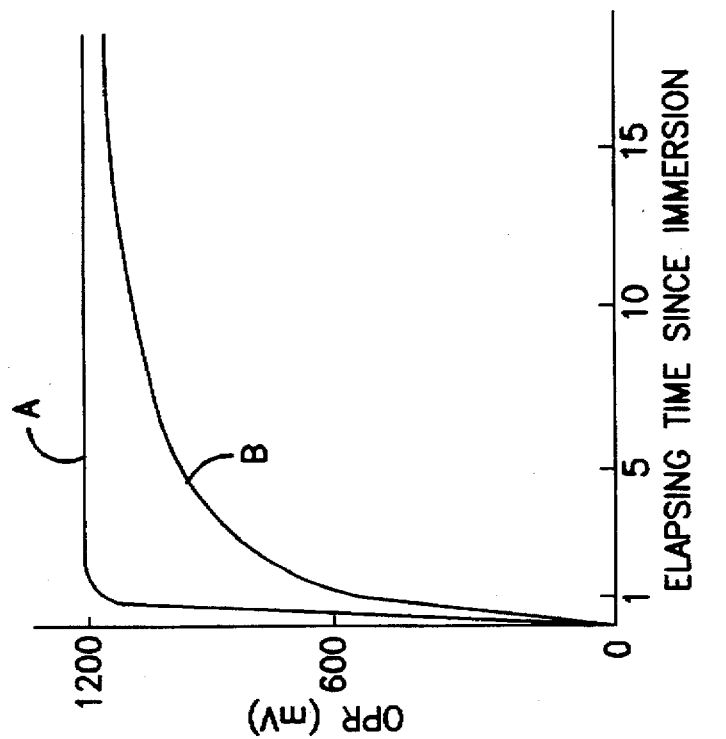
FIG. 5 is a characteristic graph which indicates an elapsing time-dependence of measured values in ORP since immersion of an ORP (oxidation/reduction potential) probe into an electrolyzed water.

On the other hand, it requires a certain period of time to loose after immersing a measuring probe into a solution to obtain stationary pH and ORP values. FIG. 5 shows the time elapsed as a function of measured ORP values after immersion of the measuring probes into the solutions. Two time-dependence curves shown in FIG. 5 indicate the difference between a first curve A of ORP measured just after electrolysis and a second curve B of ORP measured after 12 hours have elapsed since electrolysis. It is found that the pH and ORP values saturate (converges to stationary values) in the solution immediately after electrolysis, whereas it takes a long period of time to induce saturation in a solution for which a long period of time has elapsed since electrolysis. It takes a long period of time for saturation in an ORP value, resulting from a low reaction speed of the electrolyzed water for which a long period of time elapsed since electrolysis. In other words, there is only a small wet processing effect in such electrolyzed waters within a certain time period. It was found that effectiveness of a wet processing (for instance, a cleaning effect) increases with a decreasing time to saturation, and electrolyzed water immediately after the electrolysis provides a larger effectiveness even if two electrolyzed waters exhibit similar pH and ORP values to each other. Here, the pH and ORP values measured after 1 minute since immersion of the probe into the solutions are employed in the description of the present invention, although pH and ORP values may be generally defined by saturated values.

Next, the present invention will be described with reference to actual application of electrolyzed waters to wet processings.

Figure 1:
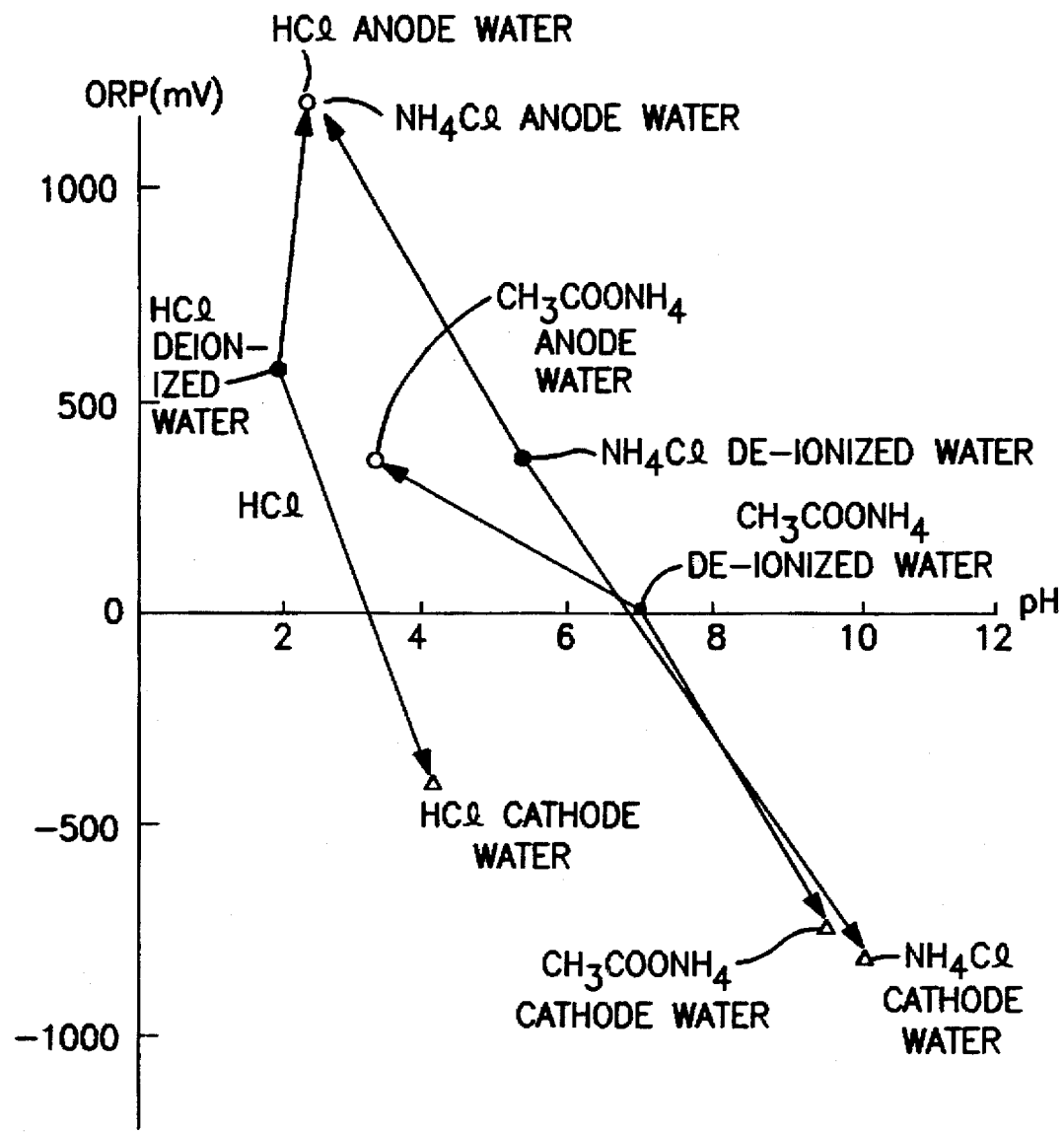
FIG. 1 is a characteristic graph indicating variations in pH and ORP values for solutions used in the present invention and prepared by addition of electrolytes.

Firstly, characteristics of anode water and cathode water obtained by electrolysis will be detailed. The characteristics of anode and cathode waters obtained by electrolysis depends on the characteristics of the electrolytes added prior to the electrolysis. Addition of electrolyte is effective for reducting the resistivity during electrolysis while selection of electrolytes has proven capable of controlling ORP values. FIG. 1 shows changes in pH of de-ionized (ordinate) waters which include three species of electrolytes (ammonium chloride, ammonium acetate and hydrochloric acid) at 0.05 weight (wt) percent (%) and in ORP (absicca) value, during electrolysis. The electrolysis is performed in a two-chamber type while a porous membrane is adopted as a separating film.

It is recognized that an electrolysis induces a high oxidizing water on the anode side while a high reducing water on the cathode side. Comparison among three species of electrolytes clarifies that an electrolyte including chlorine ions generates an anode water having a large ORP value while an electrolyte including ammonium produces a cathode water having a small ORP value (a large reducing activity). Besides chlorine, bromine and iodine are recognized to have a similar effect as electrolytes for enlarging ORP values of an anode water. Accordingly, it is advantageous in obtain an anode water having a high oxidizing activity by employing salts such as ammonium chloride as an electrolyte beside hydrochloric acid, bromine solution, iodine solution etc.

On the other hand, it is advantageous to obtain a cathode water having a small ORP value (for instance, -800 mV), namely a large reducing activity, by employing salts such as ammonium chloride, ammonium acetate, ammonium fluoride, ammonium nitrate, ammonium bromide, ammonium iodide, ammonium sulfate, ammonium oxalate, ammonium carbonate, ammonium citrate, ammonium formate etc. as electrolytes besides aqueous ammonia There exists an optimum selection of electrolytes for most adequately performing a specified wet processing, although the electrolyzed water obtained by electrolysis of a solution wherein the many electrolytes mentioned above are added operates effectively during various kinds of semiconductor wafer processing. As shown later in some embodiments, an electrolyzed water scarcely containing chlorine ions exhibits a more remarkable effect because a wet processing after dry etching performed in an environment containing chlorine gas is generally directed to eliminating chlorine ions. Accordingly, ammonium acetate etc. as an electrolyte is preferred over of ammonium chloride.

A high ORP value measured in an anode water or a low (a largely negative) ORP value measured in a cathode water has not been obtained without electrolysis up to now. ORP values of chemicals generally used for semiconductor processing are measured by employing silver/silver chloride electrodes at room temperature. Comparison conducted at condition of 0.005 mol/l indicates that ORP values are obtained at 550 mV by hydrochloric acid, 500 mV by hydrofluoric acid, 580 mV by sulfuric acid, 400 mV by hydrogen peroxide aqueous solution and 80 mV by aqueous ammonia, while up to about 1200 mV by anode waters and down to about -850 mV by cathode waters in ORP value. Accordingly, it is clear that the electrolyzed water exhibits specific characteristics which have not been obtained by combination of conventional chemicals.

Next, application of electrolyzed waters to semiconductor surface processings will be described in which it is focused on a step for wet etching by employing cathode waters. An aqueous solution is prepared by addition of ammonium chloride at a concentration of 0.002 mol/l into deionized water, then provided into an electrolytic bath, and electrolyzed to provide a cathode water having an ORP of -800 mV in ("+" sign means oxidizing while "-" sign means reducing) and a pH of 9.8. When a silicon substrate is dipped into the cathode water, Si reacts with OH radicals to form hydroxides, thereby effecting an etching treatment. An etching rate up to about 50 angstrom/min, which is satisfactory in a practical production of semicondcutor device, is attained when the temperature of the cathode water is kept at about 65° C.

Furthermore, the cathode water-induced etching is very convenient to a selective etching wherein a $SiO_2$ film is employed as a mask. It is because the etching of silicon proceeds at a rate of 50 angstrom/min while an etch rate of the oxide remains below 0.5 angstrom/min, which raises the selectivity up to more than 100. The etching rate of silicon increases with an increase in quantity of ammonium chloride added into de-ionized water while showing a tendency to saturation, finally saturating when the added quantity approaches 0.08 mol/l. As described above, an etch-rate in an electrolyzed water increases with an increase in an added quantity of ammonium chloride while a plain ammonium chloride aqueous solution that has not been subjected to any electrolysis does not exhibit any etching reaction no matter how much the concentration may be increased, which verifies the specific effects inherent to the electrolyzed water.

A plain aqueous ammonia having a concentration of 0.002 mol/l exhibits 9 and +20 mV in pH and ORP values, respectively. The aqueous ammonia, if used instead of a neutral ammonium chloride solution, provides at most 5 angstrom/min in an etch-rate of a Si wafer, which means that an electrolyzed water containing ammonium chloride at a concentration similar to that of aqueous ammonia exhibits a higher etch-rate, more than ten times that of the aqueous ammonia. Specifically, the electrolyzed water provides an etch-rate satisfactorily applicable to practical treatments and can replace the conventional etching treatments which have been performed by heating up to about 75° C. of the conventional chemicals, such as a mixed acid consisting of hydrofluoric acid, nitric acid and glacial acetic acid, aqueous ammonia-hydrogen peroxide mixture ($NH_4OH:H_2O_2:H_2O=$ 1:4:20, referred to as APM hereinafter), choline solutions, KOH solution etc.

Moreover, the APM solution which has been applied to a selective etching of silicon employing a $SiO_2$ film as a mask has at most between one and two in selectivity, i.e., in a ratio of etch-rate of Si to etch-rate of $SiO_2$, which requires paying close attention to the application and control of the wet processing. Application of the cathode water enables a satisfactory treatment effect on the main surface of a Si substrate which is exposed on the bottom of a contact-hole, which in turn enables an electrode formation onto a cleaned surface, thereby providing remarkable increase in processing yield. Processes such as those require a considerably slow etch-rate, which is easy to attain through a decrease in the additive quantity of ammonium chloride.

Figure 6:
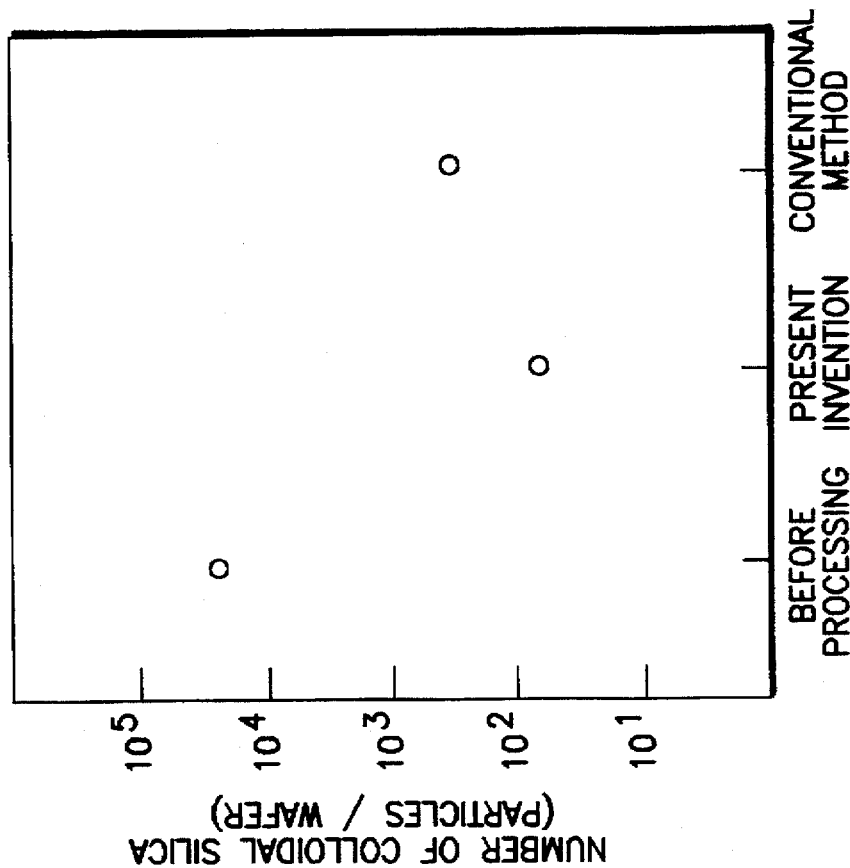
FIG. 6 is characteristic graph showing cleaning effects of colloidal silica.

A cathode water having a slow etch-rate range is applicable to removing inorganic particles residual on a silicon substrate. For example, an embodiment applied to removing colloidal silica adhered onto a Si substrate which has been subjected to CMP (chemi-mechanical polishing) will be described below. FIG. 6 shows a cleaning effect attained by a ten minute overflowing of a cathode water having −720 mV and 8.2 in ORP and pH values, which has been prepared by electrolysis of an electrolytic solution including ammonium chloride at concentration of $5×10^{-5}$ mol/l, in comparison with a conventional method using an APM solution. The result indicates that colloidal silica remained at more than 2000 particles/wafer prior to treatment reduced down to 80 particles/wafer. It is an excellent result as compared to the result of 100 particles/wafer which is attained by the conventional APM solution. Hence, employment of cathode water reduced concentration of chemicals and improved operational safety. Cathode waters having ORP values less than −700 mV and pH values more than 8 are especially effective for removing those inorganic particles. Electrolyzed waters obtained from solutions including ammonium chloride or ammonium acetate only at a rate of $2×10^{-5}$ mol/l have also enough effective. This cathode water treatment is employed to remove particles by a minute amount of etching a silicon surface. Simultaneously, the cathode water exhibited an advantage that particles are difficult of re-adhesion onto the silicon substrate surface in the cathode water.

Furthermore, a cathode water produced from electrolytes added by an extremely minute amount ranging from about $1×10^{-4}$ to about $1×10^{-5}$ mol/l is also effective to remove through reducing activity a natural oxide film formed on the silicon surface and which would frequently pose problems. It is preferable to treat the substrate with an approximately neutral cathode water having an ORP value less than −500 mV and a pH value between 7 and 8 and warmed up to about 50° C. When treated in a cathode water having an ORP value of −700 mV and a pH value of 8, hydrogen atoms which terminate the dangling bonds located on the surface of a silicon substrate existed stably for more than twelve hours, which certifies suppression of re-growth of the natural oxide film.

Conventional procedure employing diluted hydrofluoric acid solution for removing the natural oxide film has several hours of an effective period of time for suppressing re-growth of the natural oxide film. The cathode water treatment according to the present invention not only lengthens the duration period for hydrogen termination but also can avoid the usage of hydrofluoric acid known to be dangerous chemical. Moreover, the cathode water treatment has a great advantage as compared with the diluted hydrofluoric acid solution, in that it can remove only a natural oxide film even when the natural oxide film exists on the selectively exposed silicon surface, such as on the bottom surface of a contact hole, or when Al and $SiO_2$ co-exist on a wafer surface.

Figure 7:
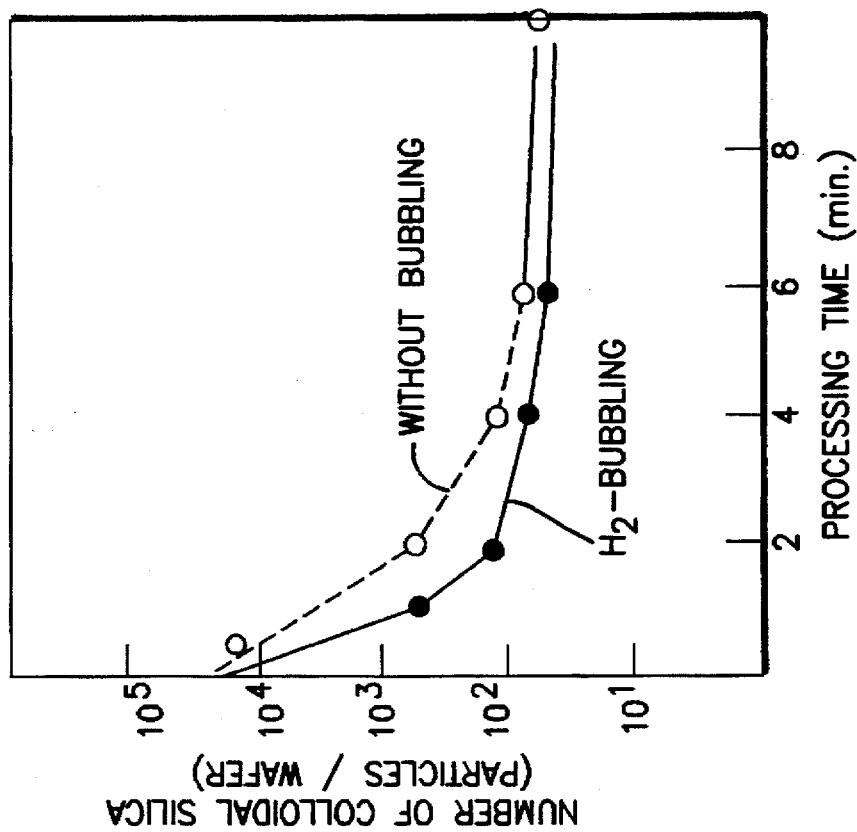
FIG. 7 is characteristic graph illustrating cleaning time-dependence of colloidal silica.

In the foregoing paragraphs, a cathode water obtained by hydrolysis of an aqueous solution obtained by addition of either ammonium chloride or ammonium acetate at a concentration ranging from 0.1 to $2×10^{-5}$ mol/l has been described as to application to treatment of Si surface by the cathode water. In those paragraphs, the effectiveness of a cathode water having an ORP value less than −500 mV and a pH value larger than 7 is clarified. Hydrogen-bubbling of the cathode water to dissolve hydrogen gas into the cathode water enhanced the reducing activity of the cathode water, increased the removing efficiency for inorganic particulates, reduced the treatment period off time (refer to FIG. 7) and enlarged the suppressing period of time for re-growth of a natural oxide film up to more than 24 hours. Measurement of dissolved hydrogen concentration after hydrogen-bubbling for about a minute clarified a concentration of 1.3 ppm in dissolved hydrogen, which is almost a saturated value at room temperature. $H_2$-bubbling of the cathode water improved the etching uniformity of silicon and, consequently, improved surface smoothness of the silicon after etching. The reason why the etching uniformity is attained is considered due to the fact that the activity of the cathode water as a reductant was improved by the hydrogen-bubbling.

On the other hand, the addition of $H_2O_2$ into the obtained cathode water enhanced the oxidizing activity, and suppressed the etch-rate of a silicon substrate, resulting in effecting an etching treatment substantially without an increase in surface roughness or without increase in a removal efficiency of inorganic particulate contaminants. Effectiveness was confirmed under the condition wherein the quantity of $H_2O_2$ to be added ranges between a quantity similar to that of the electrolyte added for electrolysis and a quantity one digit smaller than that. UV (ultra-violet ray) irradiation as combined therewith further increased the removing efficiency.

Figure 8:
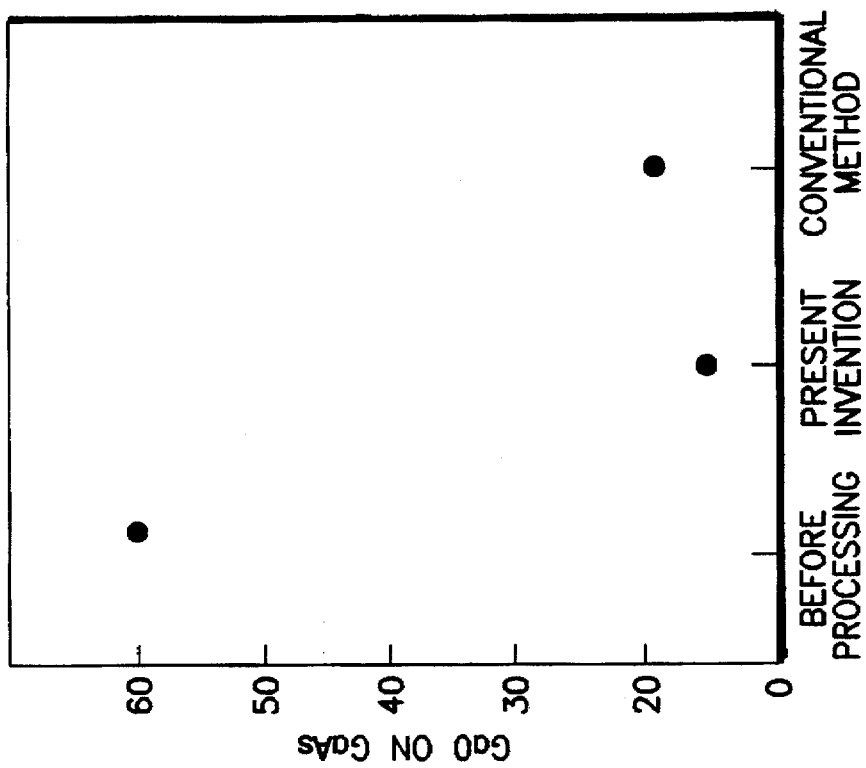
FIG. 8 is characteristic graph indicating an effect for removing natural oxide film on GaAs.

The cathode water as described above is also applicable to removing inorganic particles and natural oxide films located on compound semiconductor substrates such as GaAs, InP, ZnSe etc. beside silicon. For that purpose, it is effective to use a cathode water having a pH value ranging from 7 to about 9 and warmed up to about 70° C. For instance, a cathode water having an ORP value less than −750 mV and a pH value of 8.7, which is obtained in the cathode chamber by electrolysis of the solution including ammonium acetate of $1\times10^{-4}$ mol/l as an electrolyte, reduces density of 20000 particles/wafer in colloidal silica, which had been subjected to forced adhesion onto a GaAs substrate, down to less than 100 particles/wafer. It also reduced signal intensity of GaO observed by AES (Auger Electron Spectroscopy) analysis on a wafer surface down to the value less than a tenth of that before treatment (refer to FIG. 8).

Figure 10:
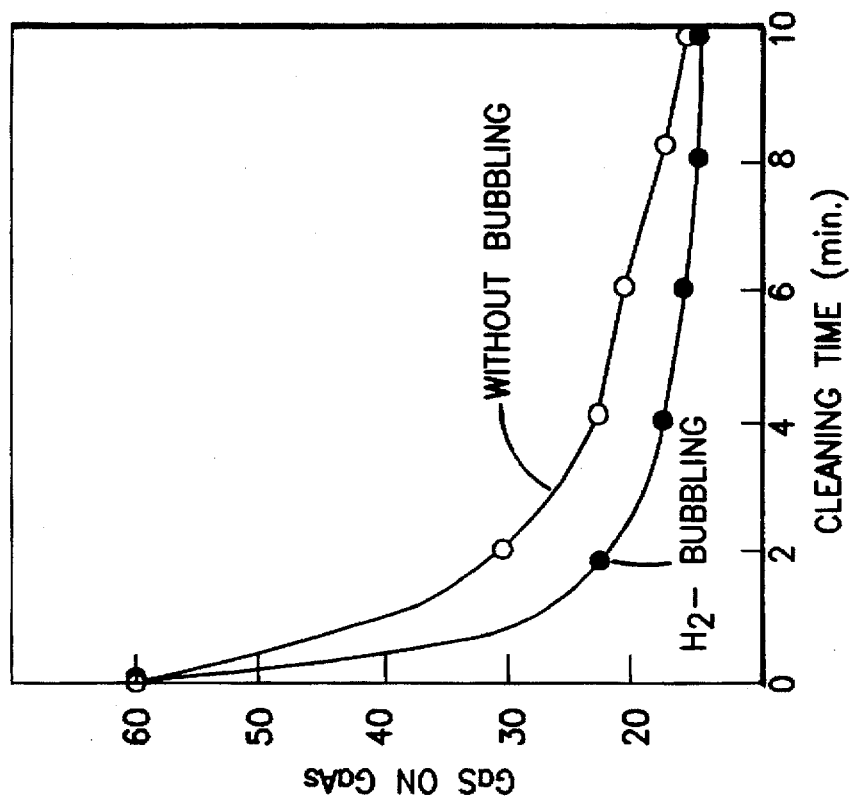
FIG. 10 is a characteristic graph illustrating cleaning time-dependence of removal of natural oxide film on GaAs.
Figure 9:
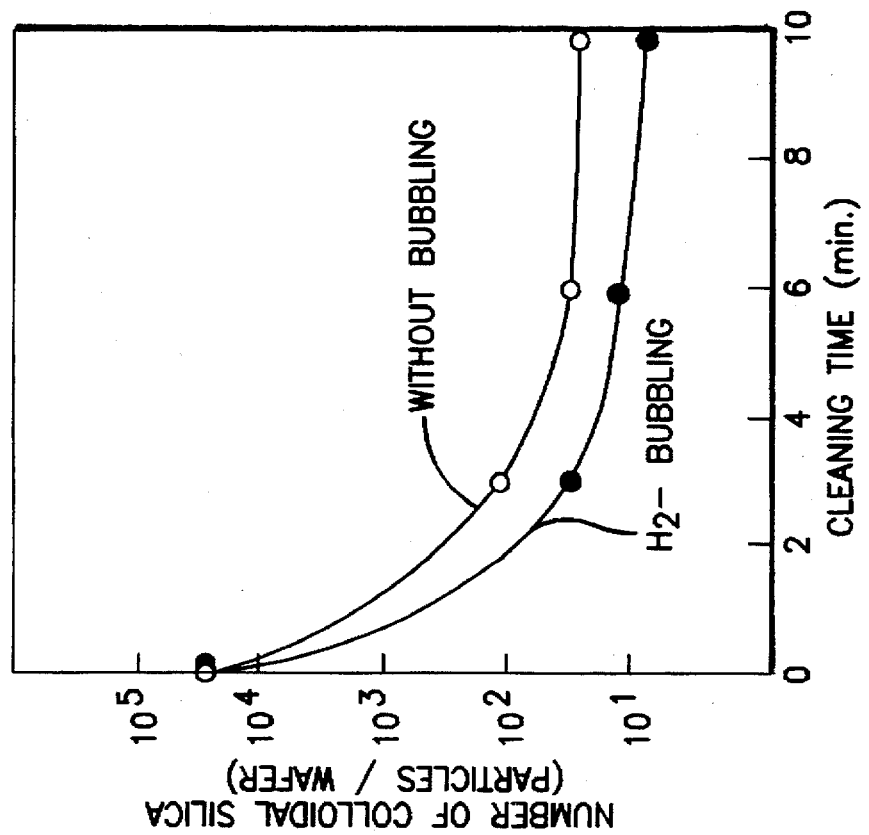
FIG. 9 is a characteristic graph showing cleaning time-dependence of removal of inorganic particles.

On those occasions, $H_2$ gas-bubbling of the cathode water for increasing the activity thereof as a reductant could further enhance the removal efficiency for both inorganic particles (refer to FIG. 9) and natural oxide films (refer to FIG. 10). Up to now, organic solvents have mainly been employed to remove inorganic particles on a substrate surface while DHF (HF:$H_2O$=1:100) etc. have mainly been used to remove natural oxide films. Enlargement in field of application of the cathode waters remarkably reduces the quantities of hydrofluoric acid and organic solvents consumed.

Figure 11:
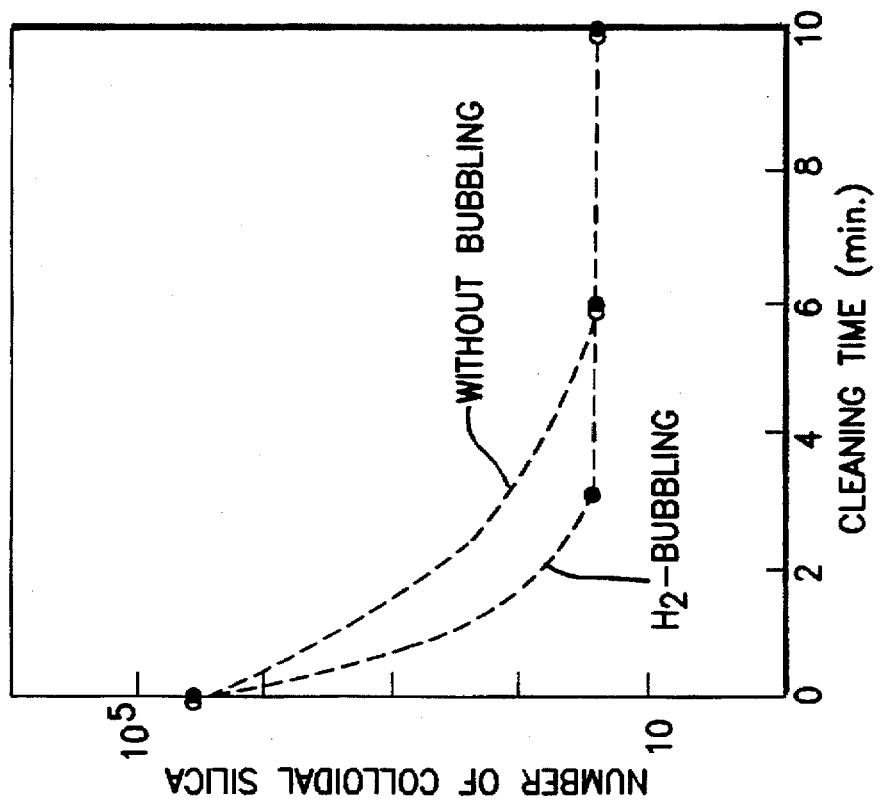
FIG. 11 is a characteristic graph indicating cleaning time-dependence of removal of colloidal silica on a metal.

Here, another embodiment will be described wherein a cathode water is applied for removing surface particles from semiconductor substrates. The cathode water is alkaline and acts as a reductant while exhibiting an etching activity to any materials no matter whether if they are be metallic (silicidic) or insulating. The cathode water is suitable for removing such particles, because zeta potentials of both silicon and particles assume an identical sign (minus) in an alkalic solution which induces a repulsive force between the silicon and the particles, resulting in difficulty of particle adhesion no matter whether the particles are inorganic or organic. A cathode water having an ORP value of −820 mV and a pH value of 10.5, which is obtained from electrolyte containing $6.5\times10^{-3}$ mol/l of ammonium acetate, reduced polystyrene particles adhered onto metallic (silicidic) or insulator films from about 3000 particles to less than 100 particles. It also reduced colloidal silica on a metal (silicide ) and insulator films from 30000 particles to less than 100 particles. On that occasion, bubbling for dissolving $H_2$ was also effective. FIG. 11 shows that colloidal silica can be effectively removed in a short period of time.

Up to now, a mixed liquid of $NH_4OH:H_2O_2:H_2O$=1:1:5 etc. warmed up to 70°–90° C. have been used for cleaning treatment or a high pressure blowing jet of de-ionized water has been applied onto a substrate, in order to remove contaminations of inorganic and organic particles adhered onto a metallic (silicidic) or an insulator film. Although the latter is effective for reducing the quantity of consumed chemicals similarly to the present invention, they have many disadvantages from the industrial point of view that wafer fractures due to the high pressure jet of de-ionized water blown onto substrates and that a batch cleaning operation of wafers is difficult. The use of cathode water has solved problem such as these.

A cathode water having an ORP value less than −700 mV and a pH value exceeding 7, which is obtained by electrolysis of an aqueous solution prepared by addition of ammonium acetate at a concentration ranging from $1\times10^{-1}$ to $2\times10^{-5}$ mol/l, is effective for removing inorganic and organic particles as described above. Application of the cathode water warmed up to 70° C. can further remove even rigidly adhered organic substances such as photoresist films.

Embodiments for processing semiconductor wafers will be described hereinafter, wherein weakly alkaline cathode waters exhibit a specific activity. Up to now, only an elaborate treatment in a de-ionized water warmed around 70°–90° C. has been recognized as effective for removing ionic residues adhered onto a silicon substrate, a GaAs substrate, a metallic film, an insulator film and a mixture of those after a dry etching step. The conventional wet processing generally required a treatment for a long time in a trial and error manner.

Figure 12B:
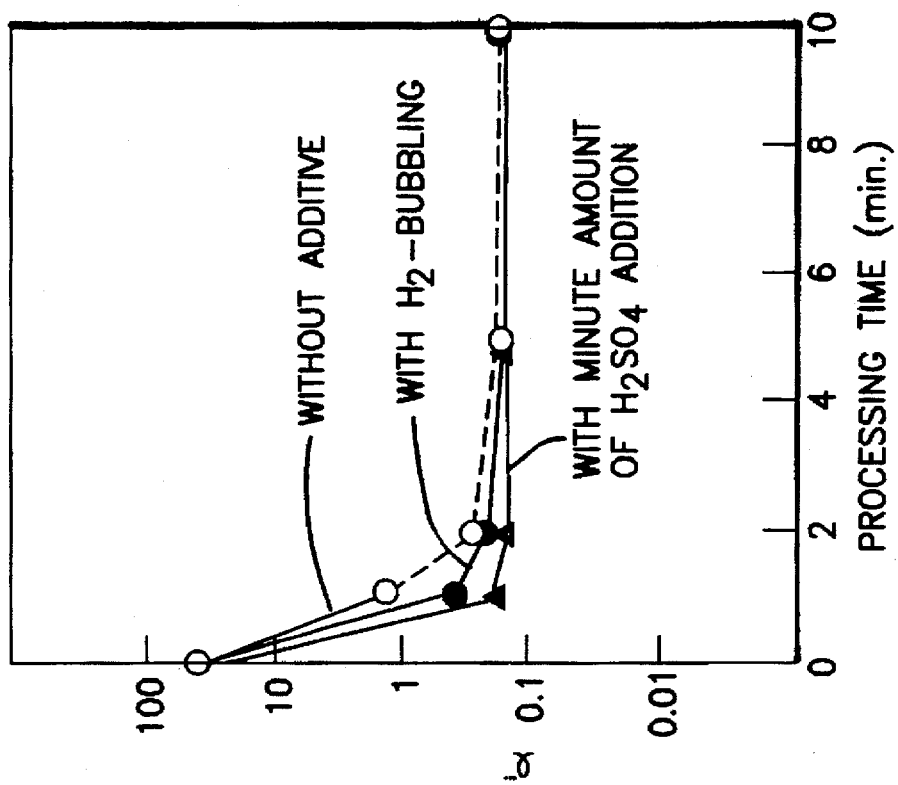
FIGS. 12A and 12B are characteristic graphs showing a cleaning solution dependence of effects for removing chlorine residual on the surface and a characteristic graph showing a processing time dependence of removal of chlorine residual-on the surface, respectively.
Figure 12A:
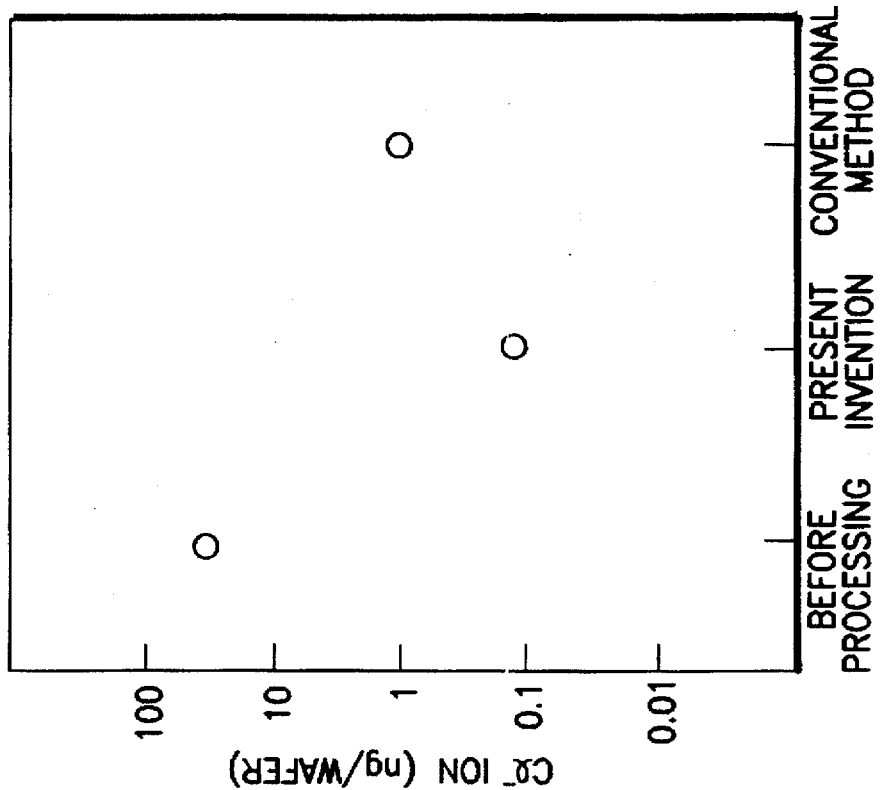

Application of a cathode water having both a weak alkalinity of a pH of about 8 and a reducing activity is effective for removing ionic residues as described above. In that case, only ionic impurities can be removed by a reducing reaction while substantially without etching any of silicon, compound semiconductors such as GaAs, metal, insulator films etc. FIGS. 12A and 12B indicate evaluation results by hydrothermally extracted ion-chromatography of the amount of chlorine ion residual on a surface of a silicon substrate which has been subjected to sputter-deposition of an Al film and to a plasma-etching in a mixed gas including chlorine ions. The cathode water (ORP:−800 mV, pH:8.9) obtained by electrolysis of an eletrolyte including ammonium acetate at $2\times10^{-4}$ mol/l is employed as a cleaning solution in the method according to the present invention. The cleaning procedure employing the cathode water reduced the residual quantity of chlorine residual on the silicon substrate by about a hundredth of that a conventional cleaning procedure employing de-ionized water warmed up to around 70°–90° C. has attained, as shown in FIG. 12A. Furthermore, it is found that a sufficient cleaning effect may be obtained if the liquid temperature of the cleaning solution is higher than room temperature of about 25° C.

The removing efficiency of residual chlorine is improved by hydrogen-bubbling which enhances the reducing activity. On the other hand, addition of a minute amount of sulfuric acid instead of hydrogen-bubbling further enhances the removing efficiency of chlorine. Sulfuric ions and phosphoric ions are known to exhibit a strong reducing activity in alkaline solutions. FIG. 12B illustrates the result where sulfuric acid is added by as much as about a hundredth of the quantity of electrolyte added before electrolysis. The validity of sulfuric acid addition was confirmed at a molar concentration ranging between about a tenth and about a five hundredth of the concentration of the electrolyte as added before electrolysis, because the liquid characteristic should be kept alkaline while the quantity of sulfuric ions should be ensured to remain at a certain level.

Cleaning by use of a cathode water having an ORP value of −750 mV and a pH of 8 and containing an electrolyte including ammonium acetate at $6.5\times10^{-5}$ mol/l can reduce surface concentrations of ionic residues both on metals ($F^-$, $Br^-$, $Cl^-$ etc.) and on insulator films ($Cl^-$, $SO_4^{2-}$ etc.) down to between 1/10 and 1/100 of the initial concentration. The cathode waters described above are also applicable both to chlorine removal from GaAs and to sulfur removal after etching in solutions including sulfuric acid, substantially without modification of the solutions.

Another embodiment as to GaAs will be described further, in which treatment employing a cathode water having an ORP value of −700 mV and a pH of 8, which is prepared in the cathode chamber from an electrolyte including ammonium chloride at $1.9 \times 10^{-5}$ mol/l, reduced the residual quantity of Cl on a GaAs substrate having 6 inches in diameter down to less than 10 ng (nano gram).

Effectiveness of the cathode water has been described for removing ionic residues hereinbefore. Its effectiveness is specifically characterized by being applicable to removal of naturally grown oxide films on the materials, such as Al and silicide, which have only poor chemical durabilities. Until now, physical procedures such as Ar-plasma sputtering have been employed for removing natural oxide films on those materials. However, the physical procedures induced some damages on exposed surfaces of silicon substrates and generated charge build-up phenomena, resulting in degradation of breakdown voltage in insulator films.

Figure 13:
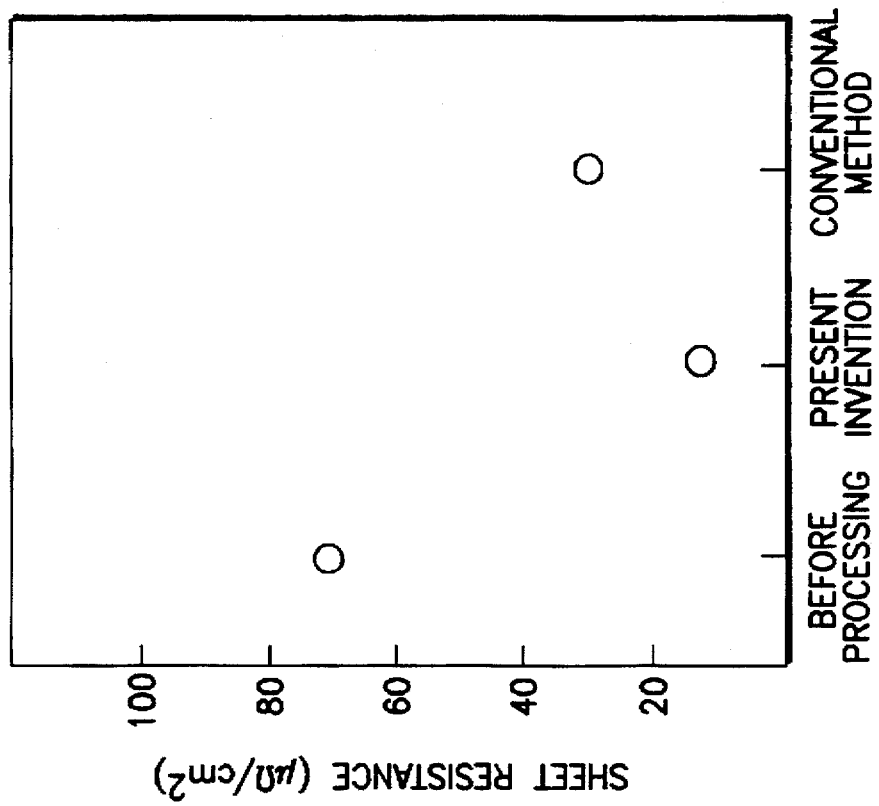
FIG. 13 is a characteristic graph illustrating sheet resistances measured on silicide films.

On the contrary, employment of a cathode water can remove natural oxide films from interconnecting surfaces, substantially without the problems as described above. FIG. 13 demonstrates sheet resistance measured for a silicide layer after subjected to processings for removing natural oxide films. If a natural oxide film formed on a silicide layer can be satisfactorily removed, the sheet resistance as determined will exhibit a low value. Treatment employing a cathode water having an ORP of −800 mV and a pH of 8.5, which is prepared by electrolysis of an aqueous solution including ammonium chloride at $9 \times 10^{-3}$ mol/l, reduced the sheet resistance of about 70 $\mu\Omega/cm^2$ prior to treatment down to about a fifth. It is proven that the conventional technologies can be satisfactorily replaced by a cathode water treatment according to the present invention, in view that Ar-plasma etching exhibits only a reduction to about ½.

As to removal of ionic impurities, it is preferred to use a cathode water having an ORP value of less than −700 mV and a pH value ranging from 7 to 9 and obtained by electrolysis of an aqueous solution including ammonium acetate at a concentration ranging between $8 \times 10^{-2}$ and $2 \times 10^{-5}$ mol/l for removing ionic impurities substantially without etching various species of materials as described above. The range, however, is enlarged if the processing allows etching of the underlying materials to some extent, and even cathode waters having ORP values less than −120 mV and pH values exceeding 7 can be used.

Hereinafter, other embodiments will be detailed wherein anode waters are applied to processings for removing metallic contaminants out of semiconductor wafers. A semiconductor manufacturing process frequently requires wet processings for removing metallic contaminants (Fe, Cu, Al, Ni etc.). The reason therefore is that a semiconductive material contaminated with metals, especially with heavy metals, generates deep energy levels which act as recombination centers of electrons and holes having large cross-sectional areas for capture, degrading electric characteristics of a semiconductor device.

Until now, solutions including strong acids have been employed as technologies for removing metallic contaminants on silicon substrates, metals and insulator films. For instance, cleaning solutions, such as a solution warmed around 100° to 150° C. and containing $H_2SO_4:H_2O_2=4:1$ (SPM) and another solution warmed around 70° to 90° C. and containing $HCl:H_2O_2:H_2O=1:1:5$ (HPM or SC-2), have been applied to cleaning silicon substrates and insulator films, while HPM etc. have been applied in the case of contaminants on a metal. Similarly, it is well known that acids such as sulfuric acid (for GaAs, InP etc.) and hydrochloric acid (for GaAs etc.) have been employed for cleaning compound semiconductors. Especially high grade chemicals have been desired for use in the electronics industry because almost all of those conventional cleaning solutions include high concentration of acidic chemicals, and removal of metallic ions, such as iron ions, from those solutions, such as $H_2SO_4$ and HCl, has been difficult. Hence, conventional processings in a solution including low grade chemicals for removing metallic contaminants will effect the solution themselves to act as sources for metallic contamination. Costs of chemicals required for removal of metallic contaminants therefore rise and quantities of wasted high concentration chemicals rise up to a vast amount. A system for guaranteeing the safety during operation is also required because the warmed chemicals are used in general.

Figure 14:
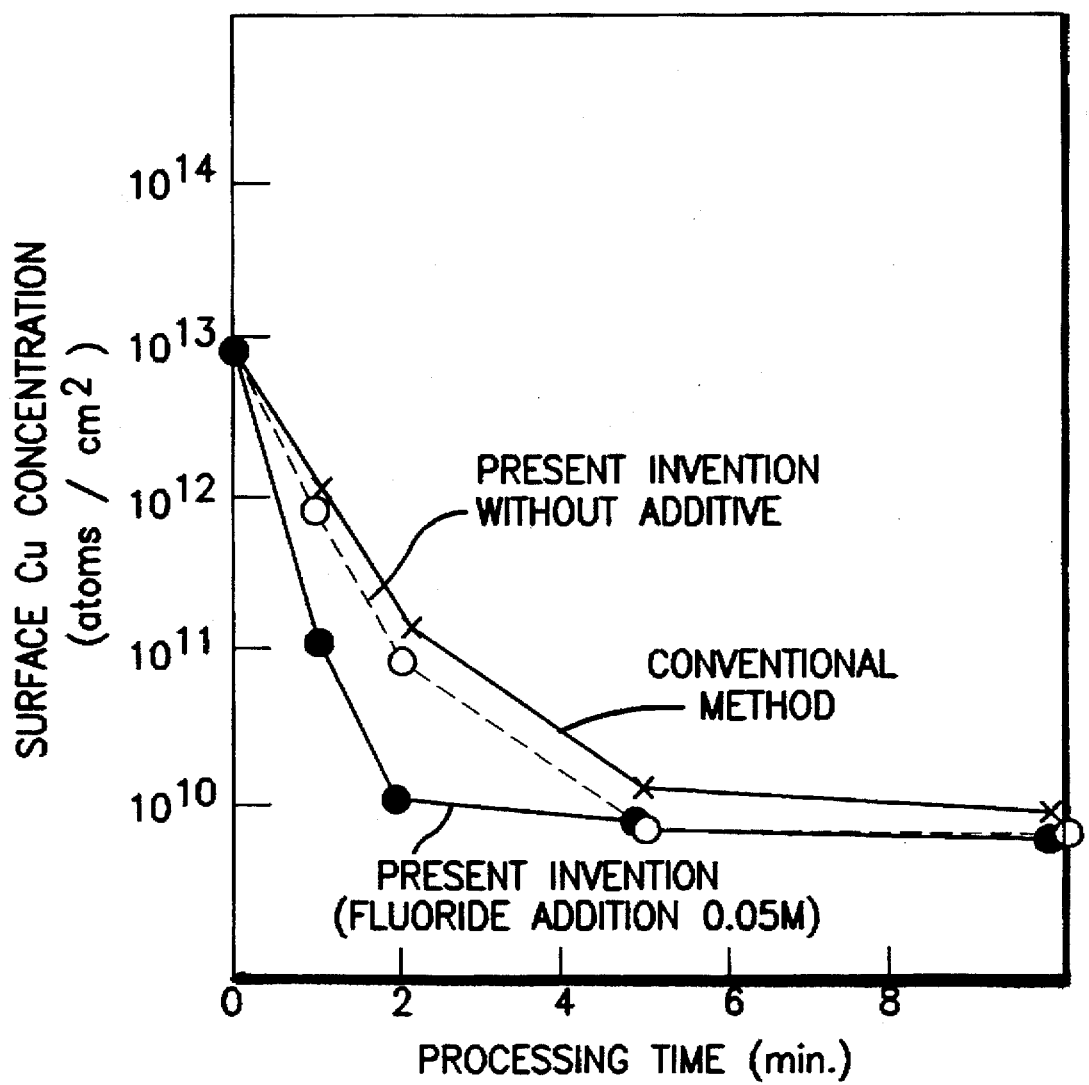
FIG. 14 is a characteristic graph indicating a processing time-dependence off Cu concentration residual on a surface.

Many problems described above will be substantially solved if an electrolyzed water according to the present invention is applied to processings for removing metallic contaminants. An embodiment will be described for a treatment using an anode water having an oxidizing potential larger than +700 mV and a pH value less than 4, which is obtained by electrolysis of an aqueous solution prepared by addition of either ammonium chloride or hydrochloric acid at a concentration between $8 \times 10^{-2}$ and $10^{-3}$ mol/l. FIG. 14 shows quality analysis results, employing Atomic Absorption Spectroscopy, in concentrations of Cu adhered onto a surface of a silicon substrate, which has been subjected to a forced contamination by Cu ions, before and after cleaning processings.

Conventional methods employing treatments by cleaning solutions such as those called SPM and HPM in abbreviation are also shown therein. An anode water having an ORP value of +1200 mV and a pH of 1.8, which is obtained by electrolysis of an aqueous solution prepared by addition of ammonium chloride at 0.01 mol/l, was warmed up to about 70° C., and applied to treatment for five minutes, thereby reducing initial $10^{13}$ atoms/$cm^2$ in Cu concentration on a silicon substrate before cleaning to less than $10^{10}$ atoms/$cm^2$ and consequently providing cleaning effects not lower than that of the conventional processings. Application of the anode water to processing for removing metallic contaminants both on metal (silicide) and on insulator films also exhibited effective, results in reducting the of Cu concentration from $10^{13}$ atoms/$cm^2$ to less than $10^{10}$ atoms/$cm^2$ in both cases.

Moreover, addition of either chelating agents or acids into the anode water was effective for removing metallic contaminants as recited above. Chelating agents and acids are both effective for avoiding re-adhering behaviors of dissolved metallic contaminants onto wafers because chelating agents and acids form comparatively stable compounds, as a result of being ionized by oxidizing reactions to form complex ions and then combined with metallic ions. Specifically, the addition of a minute amount of chelating agents or acids into the anode water improves a stability in effectiveness for removing metallic contaminants by the anode water.

In case of wet processings of a wafer, the quantity of is metallic ions dissolved in solutions increases while the removal efficiency of contaminants decreases, with increasing number of wafers to be processed. In this case, addition of either chelating agents or acids into the cathode water increased the number of wafers which could be processed by two or three times, while keeping the removal effect of the metallic contaminants at a certain level. Employment of chelating agents such as aqueous ammonia, ethylene diamine or EDTA (Ethylene Diamine Tetra-Acetic acid) or acids, such as hydrochloric acid, formic acid and nitric acid, which include comparatively less impurities, when used as an additive, proved that a common addition effect exists in an addition quantity ranging from $10^{-2}$ to $10^{-4}$ mol/l, providing somewhat different effects depending on the conditions whether or not an electrolyte is added during preparation of the anode water and on the species of chelating agents or acids used therein.

An increase in additive quantity exceeding $10^{-2}$ mol/l induces variations in solution characteristics such as the ORP value, resulting in a tendency to rather degrade the cleaning effect. On the other hand, reduction in additive quantity to less than $10^{-4}$ mol/l reduces the additive-induced effect, resulting in approaching the effect as obtained by a plain anode water.

An anode water is also applicable to processes for removing metallic contaminants (Fe etc.) on a naturally grown oxide film as well as included in naturally grown oxide films and thermally grown oxide films. Until now, a natural oxide film has been removed by BHF ($HF+NH_4F+H_2O$), DHF ($HF+H_2O$) solution etc., whereby metallic contaminants on and in the oxide films have been removed. Those conventional technologies, however, have encountered with problems that minute particles re-adhere onto a silicon substrate surface after processings and a metal (for instance, Cu), whose ionization tendency is less than that of silicon, rather deposit from the solution, if the minute particles are contained therein, onto the silicon substrate, besides the existing problem of applying heavily concentrated chemicals.

As countermeasures to the above problems, a process employing an anode water having an oxidizing potential larger than +700 mV and a pH value less than 4, which is obtained by electrolysis of an aqueous solution prepared by addition of ammonium chloride or hydrochloric acid as an electrolyte at a concentration ranging from $8\times10^{-2}$ to $10^{-3}$ mol/l, is applied to the silicon substrate, after the anode water is combined with hydrofluoric acid to obtain a cleaning solution containing hydrofluoric acid at a concentration ranging from $10^{-1}$ to $10^{-3}$ mol/l.

The cathode water by itself scarcely has an activity to etch off oxide films. Addition of hydrofluoric acid, however, enables etching-off oxide films as well as removing metallic impurities included in the natural oxide film. Treatment proceeds with an etching reaction together with an oxidizing reaction on the surface of the silicon substrate, which hinders the crystalline surface of silicon from exposing to the cleaning solution, resulting in neither particle adhesion nor Cu deposition that the conventional processings have encountered.

Figure 15:
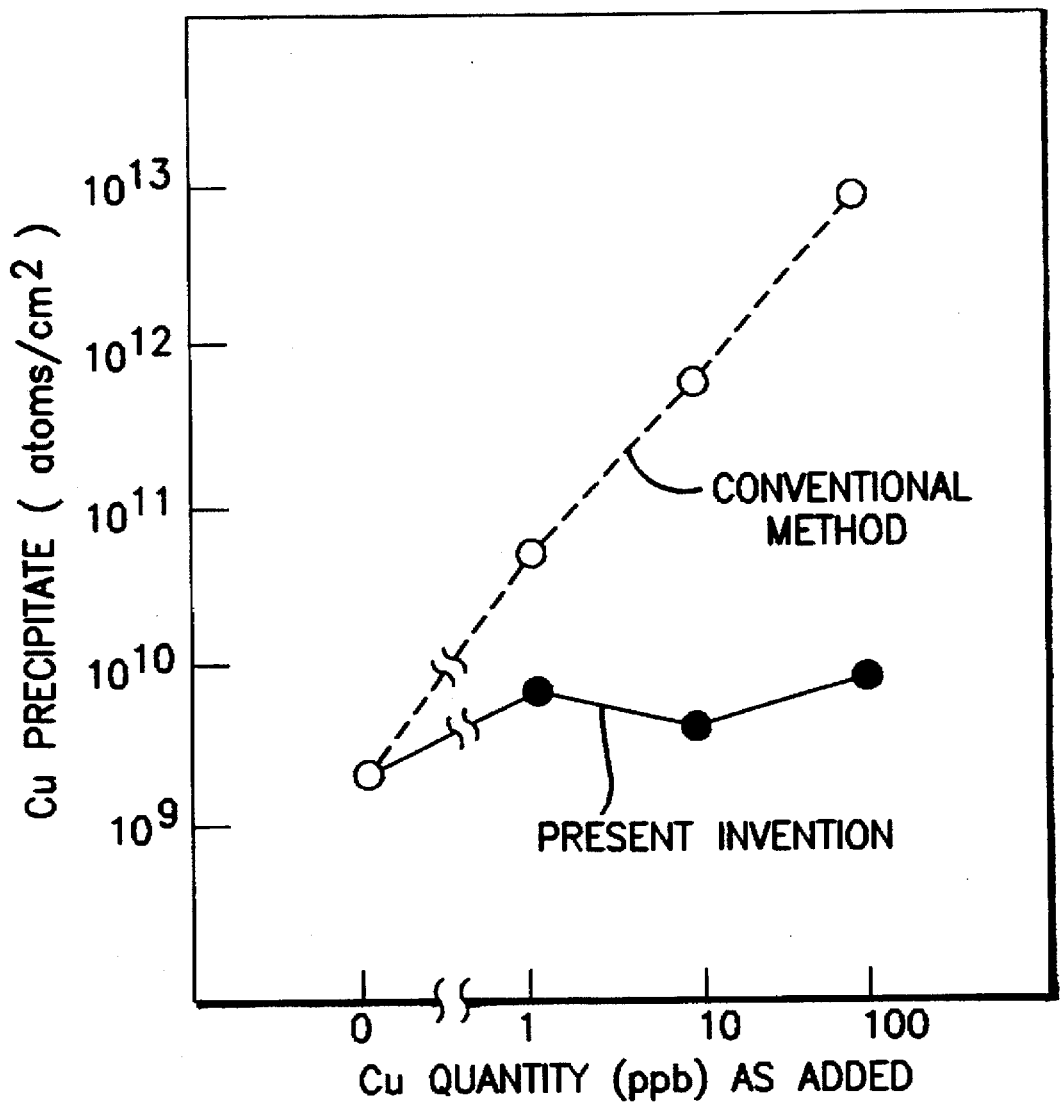
FIG. 15 is a Cu con-centration residual on wafer surfaces after processing in solutions obtained by addition of Cu at different concentrations.
Figure 16:
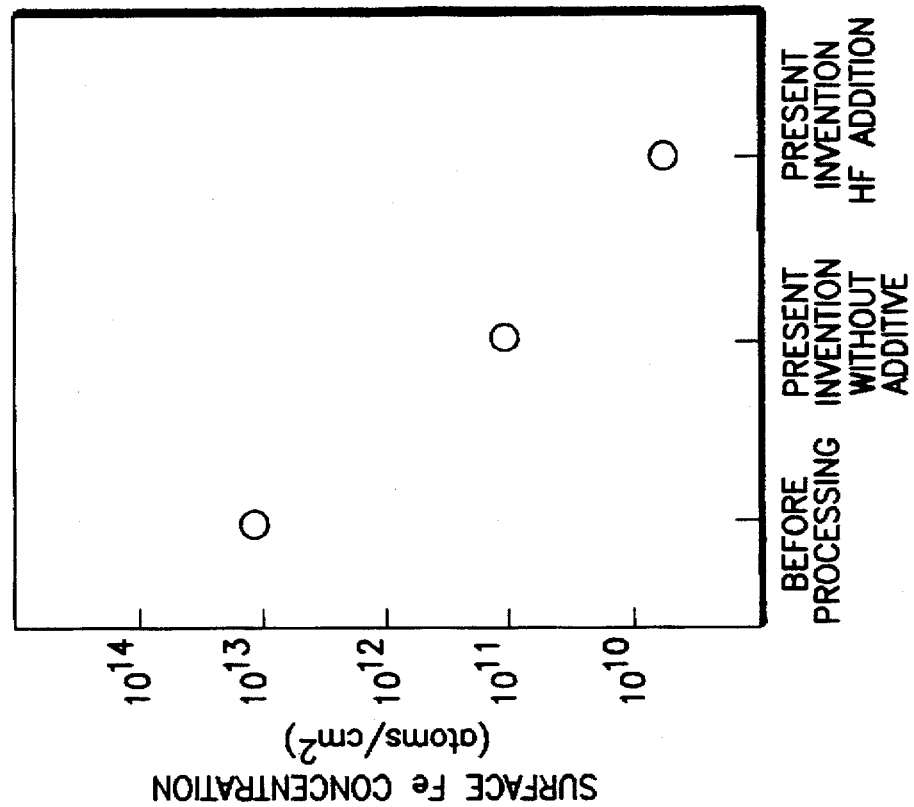
FIG. 16 is a characteristic graph showing an effect for removal of Fe residual on a surface.

FIG. 15 provides analysis results, employing atomic absorption spectrophotometry, of Cu concentration on a wafer surface which has been subjected to processings in cleaning solutions containing with certain quantities of Cu. Processings in the conventional BHF solution increase Cu deposition quantity onto a Si substrate with increasing Cu additive quantity, while processings in the anode water added by hydrofluoric acid keep Cu deposition quantity less than $10^{10}$ atoms/cm$^2$, independently of Cu additive quantity. Furthermore, even metallic contaminants such as Fe existing in a natural oxide film can be removed effectively (refer to FIG. 16).

Figure 17:
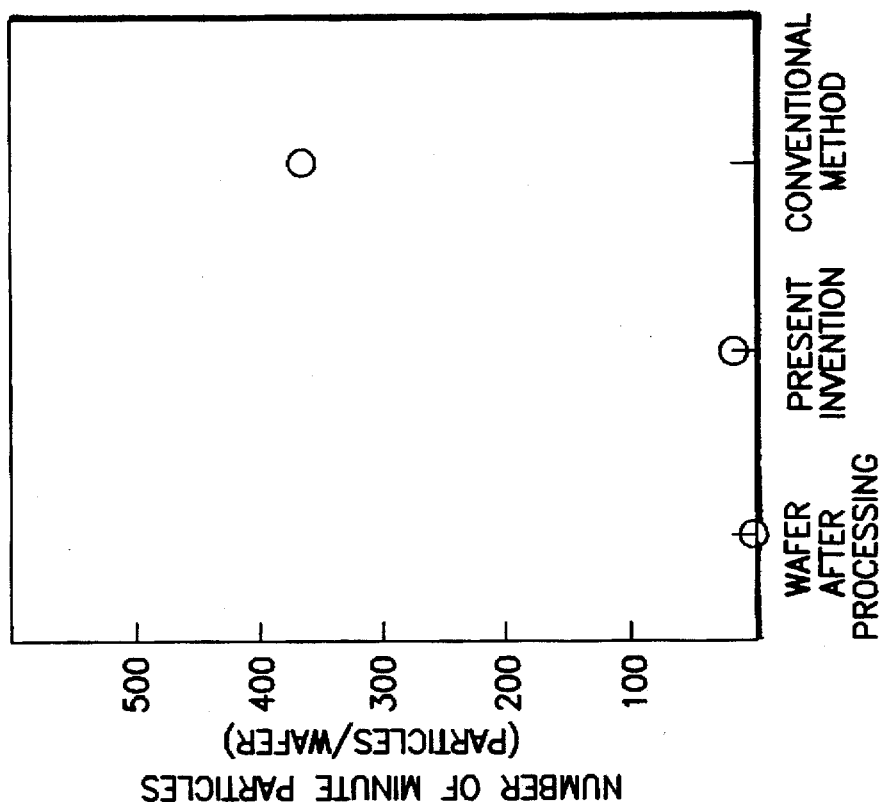
FIG. 17 is a characteristic graph illustrating a number of adhered particles for showing an effect for removal.

FIG. 17 shows adhesion quantities of minute particles once a silicon substrate. A conventional processing in BHF solution induces particle adhesion from about 300 to 400 particles/wafer onto a silicon substrate. On the other hand, an anode water having an ORP value of +1200 mV and a pH value of 1.8, which is obtained by electrolysis of an aqueous solution prepared by addition of $10^{-2}$ mol/l of ammonium chloride, was applied for treatment after being added with hydrofluoric acid at a concentration of 0.05 mol/l, to thereby obtain a reduction in the number of adhered minute particles down to about a tenth. A similar effect was also obtained by processing in an anode water prepared by electrolysis of an aqueous solution including ammonium chloride or hydrochloric acid at a concentration ranging from $10^{-1}$ to $10^{-3}$ mol/l, added with hydrofluoric acid beforehand at a concentration ranging from $10^{-1}$ to $10^{-2}$ mol/l. When ammonium fluoride is used as an electrolyte, a similar effect was obtained without addition of hydrofluoric acid.

Figure 18:
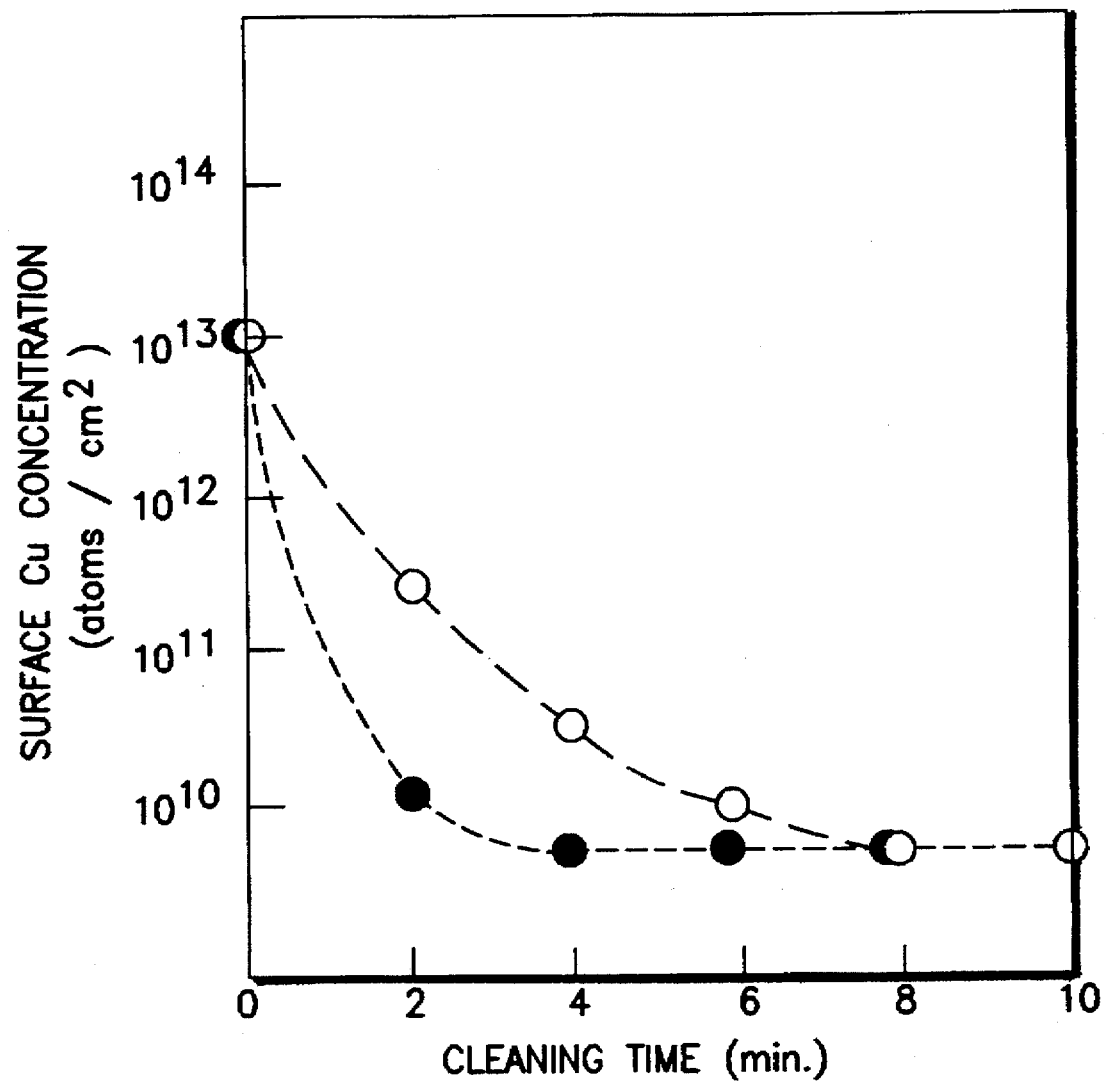
FIG. 18 is a characteristic graph illustrating processing time-dependence of surface Cu concentration.

In the embodiments described above, addition of $H_2O_2$ at a concentration ranging from $10^{-1}$ to $10^{-2}$ mol/l or $O_3$ -bubbling can efficiently remove metallic contaminants located on silicon surfaces, metals and insulator films (refer to FIG. 18).

As described above, processings according to the present invention can remarkably reduce concentration of chemicals as used and can provide a sufficient effect even in a low processing temperature, so that metallic impurities on semiconductor substrates can be removed efficiently, while operational safety for workers is guaranteed.

Hereinafter, description will be concentrated on removal of organic substances on a semiconductor wafer by employing an anode water.

Many photolithographic steps are conducted in a semiconductor device manufacturing process wherein steps for removing photoresist films are repeated. Removing organic materials including photoresist films adhered onto a wafer surface, such as one represented by a photolithographical step, is important for increasing manufacturing yields. Until now, highly concentrated and warmed chemicals such as APM solution (70°–90° C.) or SPM solution (100°–150° C.) have been employed for removing organic contaminants located on silicon substrates and on insulator films as well as for removing metallic materials on the surface of organic films or in the organic films, while warmed SPM solution (about 130° C.) has been employed for removing those materials located on metals (silicides). Removing organic materials by employing an anode water as first recited hereinbelow is based on oxidation-induced decomposition of organic materials and as effective as an alkaline cathode water, which enables also removing organic materials through minute etching of silicon substrates, insulators and metals (silicides).

First, experimental results in removing organic contaminants on silicon substrates by employing an anode water will be demonstrated. Processing in an anode water having an ORP value of +1200 mV and a pH value of 1.8, which is obtained by electrolysis of an aqueous solution prepared by addition of ammonium chloride at 0.01 mol/l, provides an effect equivalent to those of the conventional processings for removing organic materials. Processings according to the present invention reduce, as a matter of course, the quantity of chemicals used. Moreover, although enough rinsing steps in de-ionized water have been generally required in the conventional processings after using comparatively dirty chemicals such as SPM solution, electrolyzed waters according to the present invention reduce rinsing steps remarkably because the electrolyzed waters are basically diluted solutions.

Figure 19B:
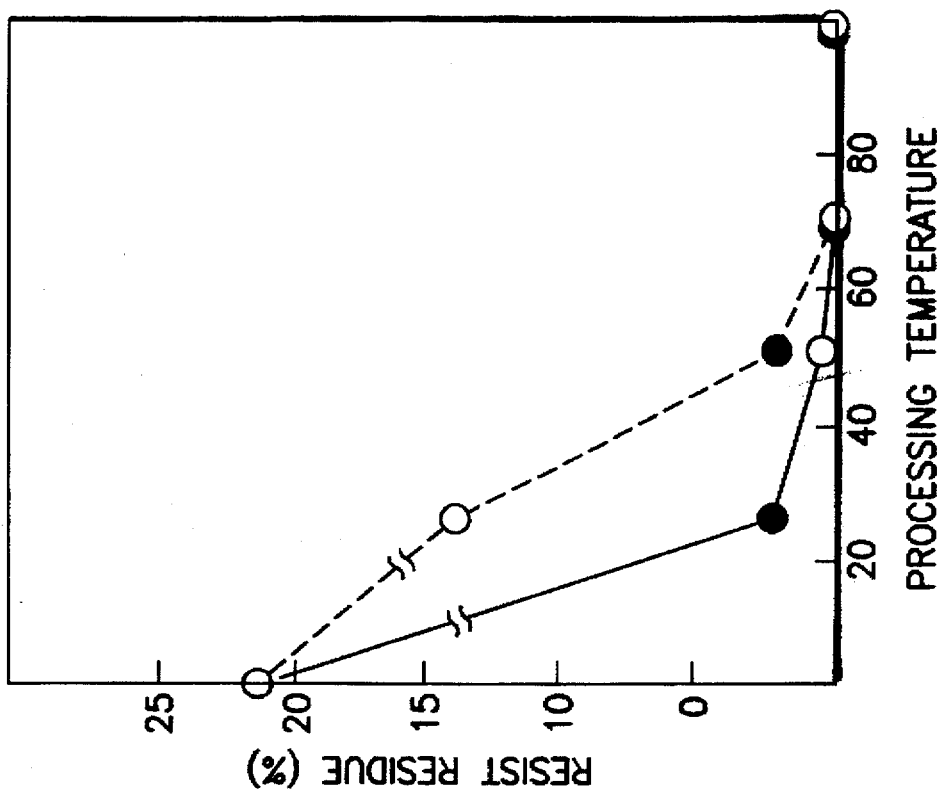
FIGS. 19A and 19B are characteristic curves indicating processing solution dependence of photoresist residues and of photoresist residues, respectively.
Figure 19A:
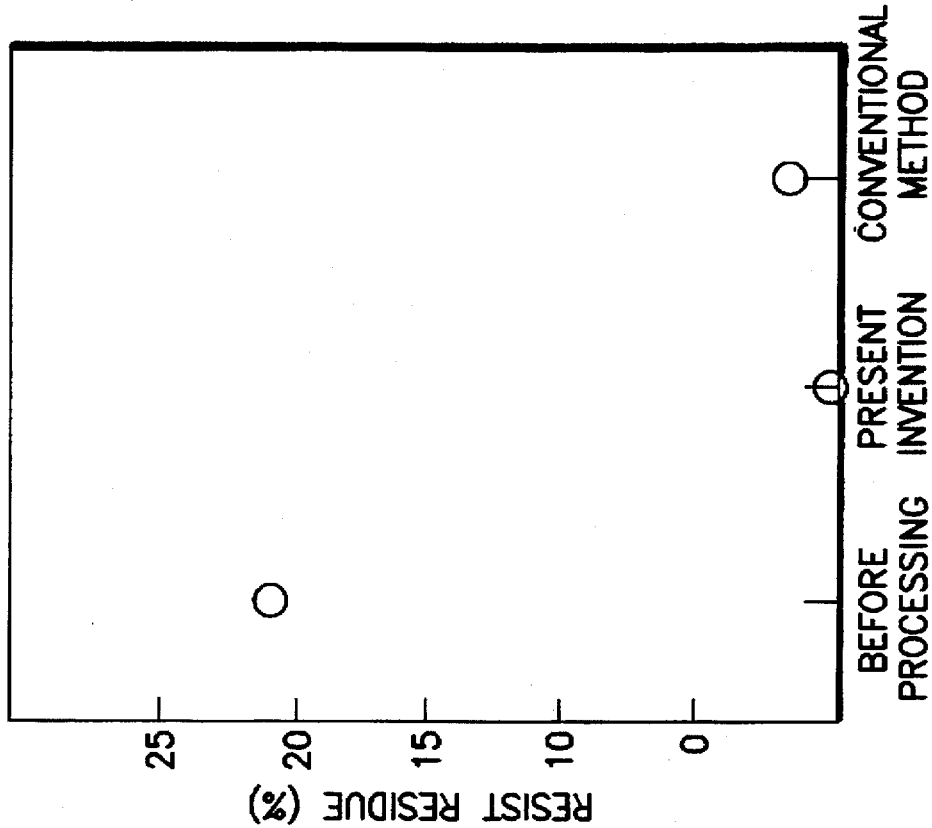

FIGS. 19A and 19B indicate resultant data experimented on removing photoresist residues. Ordinates of FIGS. 19A and 19B represent remaining rates of photoresist residues in terms of a ratio of number of patterns in which an SEM inspection can detect any of photoresist residues to total number of patterns as inspected. No photoresist residue was identified after processing according to the embodiment on a silicon substrate which had been subjected to a cleaning procedure in the anode water, which indicated an excellent effect comparable to that of the conventional cleaning procedure in SPM solution.

Processing for removing organic residues, such as photoresist residues, by employing the anode water described above is also applicable to those on an insulator film. The anode water having an ORP value of +1200 mV and a pH value of 1.8, which is the same as that used in the case of silicon surface, can remove photoresist residues substantially completely. The extent of adhesion of organic materials can be evaluated by a wetting angle (contact angle) of deionized water. A clean silicon dioxide film exhibits a contact angle not higher than about 10 degree while the contact angle increased up to about 50 degree when contaminated by organic materials. The contact angle decreased down to the value substantially as small as that of a clean silicon dioxide film after subjected to a cleaning processing in the cleaning solutions according to the present invention, which verified an excellent effect for removing organic materials compared with about 20 degree in a contact angle obtained by the conventional cleaning in SPM solution. In addition, the anode water is also effective for removing photoresist on metals (silicides).

The removing effect for organic materials as described above can be further improved by addition of a minute amount of oxidants. $H_2O_2$, at a concentration between 0.1 and 0.01 mol/l into the anode water or by $O_3$-bubbling in the anode water. A smaller time period is further attained when those processings are performed under UV-irradiation. Those effects were also confirmed with photoresist residues on insulator films.

The anode water processing is also effective for removing organic materials such as organic particles and photo-resist residues remaining on compound semiconductor substrates such as GaAs, InP, ZnSe etc. beside silicon. The conventional procedures for removing organic materials remaining on compound semiconductor substrates have been performed by employing warmed (up to about 80° C.) organic solvents. The reason therefore is that application of acidic hydrogen peroxide as used for Si substrates will effect an etching reaction of the compound semiconductor substrates themselves. Even on that occasion, the anode water having a higher acidity exhibits an excellent effectiveness as well as in silicon processing. For instance, processing GaAs substrates in an anode water having an ORP value of 1080 mV and a pH of 4, which is obtained by electrolysis of an aqueous solution prepared by addition of ammonium chloride at $5 \times 10^{-5}$ mol/l, can easily reduce organic particles polystyrene particles) from 3000 particles/wafer down to about 50 particles/wafer.

As an example of removing photoresist residues and organic films, processings employing an anode water having an ORP value of 1000 mV and a pH value of 2 reduced photoresist residues to less than 10 ng/wafer of 6 inches and reduced residual quantity of organic films to less than 20 ng/wafer of 6 inches. Furthermore, on that occasion, $O_3$-bubbling of the anode water could more effectively remove organic particulate such as contaminations, photoresist residues and organic films. In order to avoid an etching reaction in the case of compound semiconductor substrates such as GaAs, it is important not to enhance significantly the oxidizing activity. pH values greater than around 3–5 and ORP values greater than +600 mV are preferable in case of suppressing etching reaction, because strong acidity accelerates etching reaction during the removal of various species of organic materials on a compound semiconductor.

Figure 20:
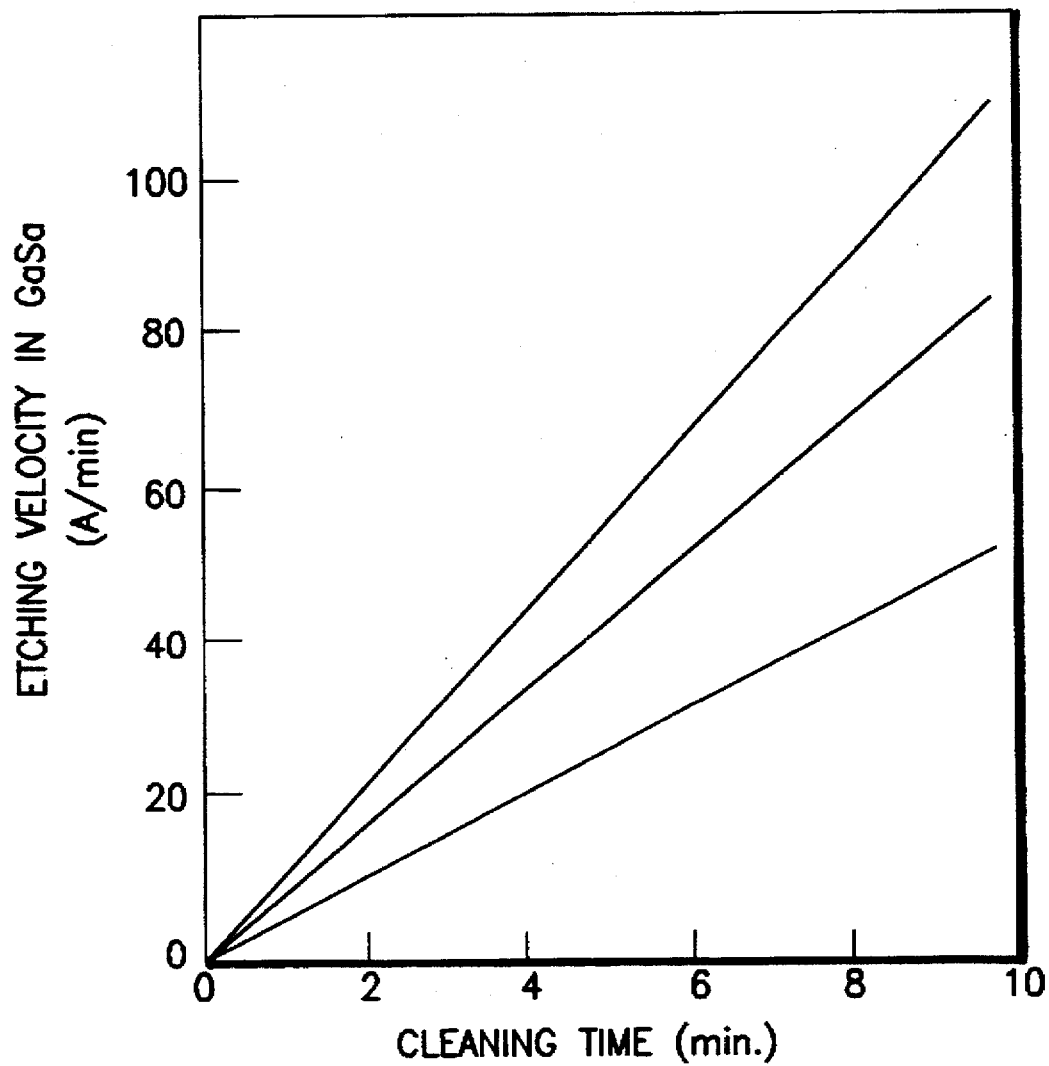
FIG. 20 is a characteristic graph showing processing solution dependence of etching velocity in GaAs.

On the contrary, an anode water exhibiting a strong acidity is useful for etching compound semiconductors such as GaAs, InP, ZnSe etc. Up to now, highly concentrated chemicals such as a mixed solution of $H_2SO_4:H_2O_2=5:1$ (by volume ratio), a mixed solution of $H_3PO_4:H_2O_2=5:1$ (by volume ratio) etc. have been employed for etching them. According to the present invention, for instance, an anode water, warmed up to 65° C., having an ORP value of 1200 mV and a pH value of 1.9, which is obtained by electrolysis of an aqueous solution prepared by addition of ammonium chloride at 0.01 mol/l, provides 80 nm/min in etch-rate of GaAs. The practical etch-rate is controllable either by enhancing an acidity of the anode water including ammonium chloride as an electrolyte through $O_3$-bubbling to accelerate etch-rate or by addition of $H_2O_2$ to suppress etching reaction (refer to FIG. 20). A practical etch-rate was obtained at a condition of added quantity of ammonium chloride between 0.002 and 0.2 mol/l, an ORP value larger than +800 mV, and a pH value less than 3.

The present invention is effectively applied to the removal of organic films on interconnections made of Al and metal silicide films which have poor durabilities against acidic and alkaline chemicals. Up to now, only organic chemicals have been applicable to those processings and a vast volume of organic chemicals have actually been consumed. However, an electrolyzed water having only a weak oxidizing activity is now proven applicable.

For instance, wet processing in an anode water having an ORP value of +800 mV and a pH value of 5.5, which is obtained by electrolysis of an aqueous solution prepared by addition of ammonium chloride at $10^{-5}$ mol/l as an electrolyte, lowered the sheet resistance of about 70 $\mu\Omega$ before the treatment down to about a tenth. This value verifies the effectiveness of a cleaning treatment according to the present invention as compared with a fifth that the conventional cleaning treatment. The validity of the cleaning treatment according to the present invention is understood in view of the fact that an organic film existing on a metallic interconnection generally acts as an insulating film which induces a rise in a sheet resistance.

Removing organic materials by employing anode waters have been demonstrated hereinbefore. However, cathode waters can also remove organic materials. Employment of cathode waters having an oxidizing activity are also effective for removing organic contaminants and photoresist residues. When a cathode water is applied for the removal organic materials on silicon substrates, metals and insulator films, the silicon substrates, metals and insulator films are etched, and further, zeta potentials have an identical sign (minus) both in the silicon substrates and in the particles, which generates a repulsive force between silicon substrates and the particles. Consequently, it induces an extremely high removing efficiency because re-adhesion is difficult to occur.

Figure 21B:
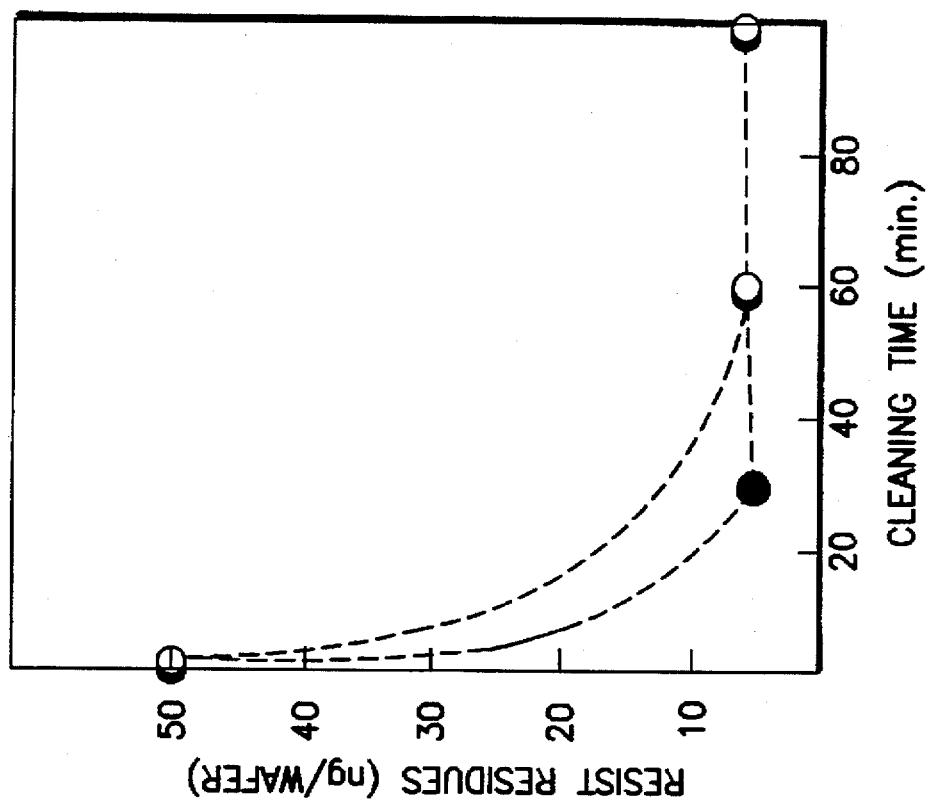
FIGS. 21A and 21B are characteristic graphs showing processing solution dependence of removal effect of photoresist residue and a characteristic graph showing processing time-dependence of residual photoresist quantities removed, respectively.
Figure 21A:
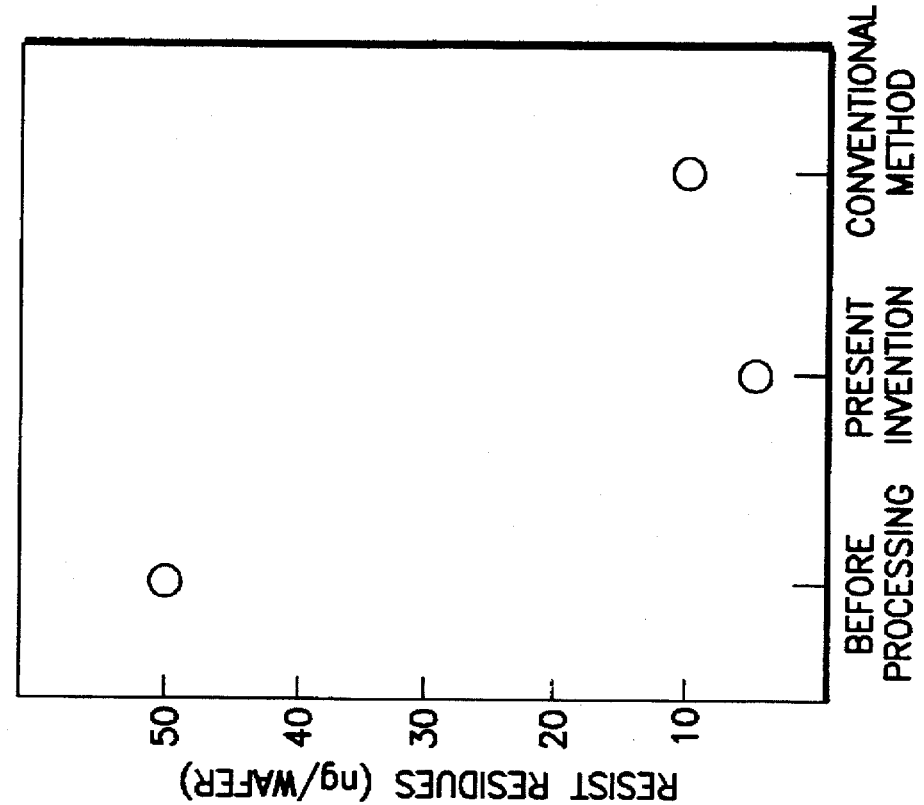

As an embodiment for those kinds of treatments as described above, a cathode water was applied having an ORP value of less than −700 mV and a pH value greater than 7, which was obtained by electrolysis of an aqueous solution prepared by addition of ammonium acetate or ammonium chloride at a concentration between 0.1 and $10^{-5}$ mol/l. For example, a cathode water, warmed up to about 70° C., having an ORP of −800 mV, which was obtained by electrolysis of an electrolytic solution including $6.5 \times 10^{-3}$ mol/l of ammonium acetate, removed photoresist residues remaining both on insulator films and metals satisfactorily (refer to FIG. 21). On those cases, hydrogen-bubbling enhances reducing reaction, resulting in an improved efficiency by about double in removing organic materials both on insulator films and metals (silicides). The removal of organic materials as described above is based on a positive application of alkalinity and a reducing activity both inherent to the cathode water.

The following are examples of processings utilizing both an etching function for underlying substance inherent to cathode waters and oxidation-induced decomposing function for organic materials due to additive oxidant. For an example, removal of organic materials and photoresist residues both on a Si substrate will be shown. A cathode water having an ORP of −650 mV and a 7.8 was prepared by addition of ammonium chloride at $2 \times 10^{-5}$ mol/l and by electrolyzing thereof, following which $H_2O_2$ was added thereto at 0.1–0.01 mol/l as an oxidizing agent to obtain a processing solution. Immersion of a silicon substrate adhered with organic materials and photoresist residues into the processing solution could remove organic materials as effectively as on insulator film and on metals to reduce the organic quantity down to less than a tenth of that before cleaning. Addition of $H_{22}$ presents effects for strengthening the oxidizing activity as well as for avoiding surface rough through suppressing excessive etching. Those effects are also attained by $O_3$-bubbling, and enhanced by combination with UV-irradiation, resulting in, for example, a smaller time period for treatment.

As a somewhat peculiar example of application, a surface oxidation of a silicon substrate will be demonstrated. A surface treatment of the silicon substrate in a chemical solution including hydrofluoric acid generally exposes an active surface of single-crystalline silicon, onto which minute particles and metals are liable to adhere. On the other hand, when a thermal oxidation is performed at a state wherein the single-crystalline surface of silicon is exposed, a surface roughness of the substrate and an nonuniform, naturally grown oxide film will generate to thereby the quality of the thermally grown oxide depending on insertion/extraction conditions of a furnace. As a result, problems of insulation failures may arise.

Here, application of electrolyzed waters solves those problems as described above. Application of electrolyzed waters according to the present invention is especially effective for post-treatment of processings in chemical solutions including hydrofluoric acid. Namely, rinsing of a silicon substrate is performed in an anode water having an ORP value larger than +700 mV and a pH value less than 4, which is obtained by electrolysis of an aqueous solution prepared by addition of ammonium chloride or hydrochloric acid at 0.1–0.001 mol/l as an electrolyte. Treatment in hydrofluoric acid itself is a process directed for the removal metallic impurities, natural oxide films and organic impurities. Immersion into the anode water, however, provides a clean and stable natural oxide film formed on the silicon substrate surface.

Until now, rinsing in an ultra-pure (de-ionized) water has been performed for about five minutes after treatment in BHF. A five minutes' rinsing was also performed after treatment in BHF, according to the present invention, by employing an anode water having an ORP value of +1200 mV and a pH value of 1.8, which was obtained by electrolysis of an electrolytic solution including 0.01 mol/l of ammonium chloride. The technology according to the present invention reduced density of minute particles by less than a tenth as compared to the value about five hundreds or more particles/wafer residual on a substrate subjected to the conventional treatment.

Figure 22:
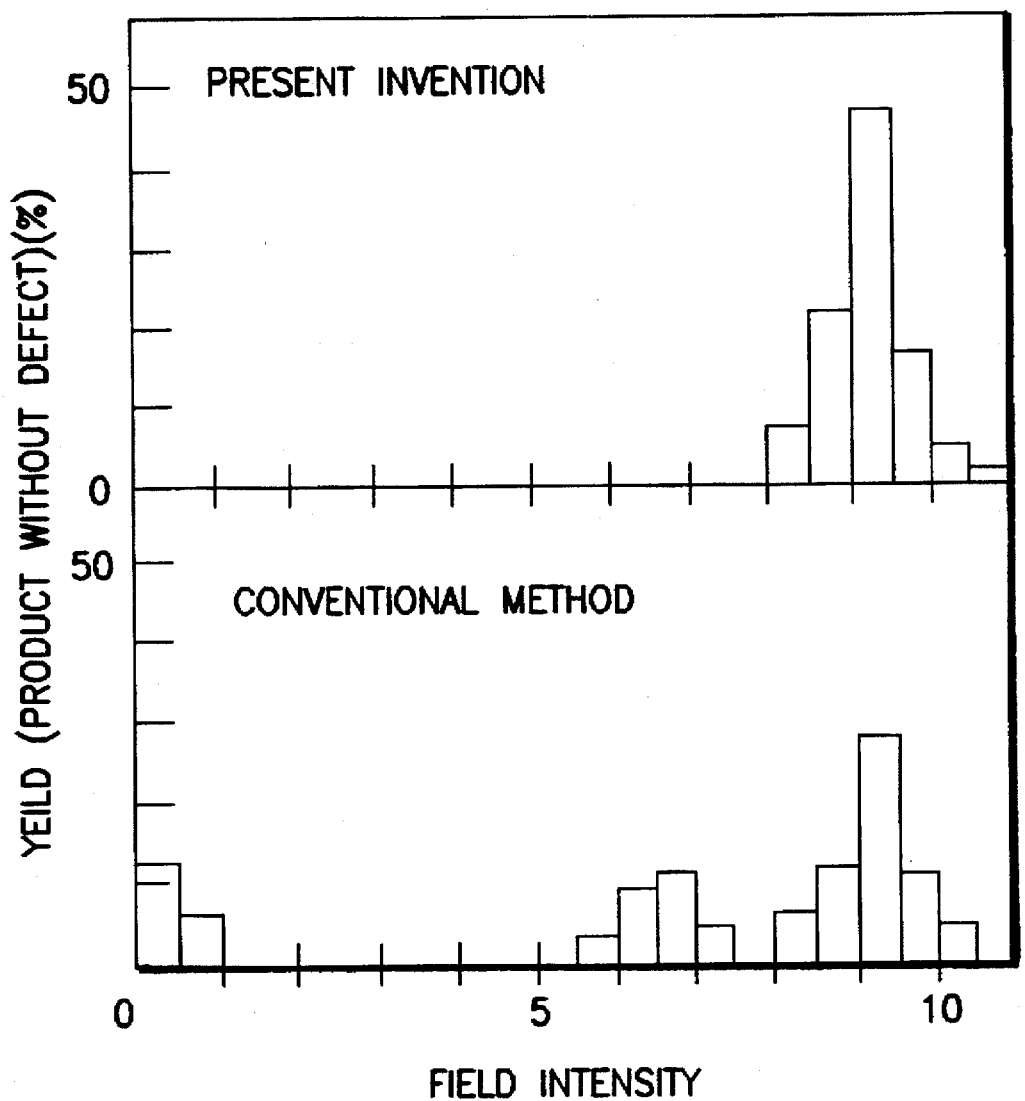
FIG. 22 is a Characteristic graph showing gate oxide breakdown field distribution of MOS capacitors.

FIG. 22 shows breakdown field distributions of gate oxide films for MOS capacitors formed by employing processings according to the present invention and by the conventional technology. Failures including metallic contaminant-induced B-mode failures and pin-hole-induced A-mode failures in oxide films which were encountered with the conventional technology are substantially eliminated.

Various species of processings employing electrolyzed waters have been described hereinbefore as to a variety of semiconductive wafers. Suitable species of electrolytes, suitable additive quantities, suitable pH and ORP values have been also described in accordance with the species of processings. As electrolytes to be added, ammonium chloride, ammonium acetate, hydrochloric acid etc. have been referred to in the embodiments. Besides those, ammonium fluoride, ammonium acetate, ammonium bromide, ammonium iodide, ammonium sulfate, ammonium oxalate, ammonium carbonate, ammonium citrate, ammonium formate and aqueous ammonia are proven effective as they far as have been confirmed in experiments.

However, the purity of electrolyte is proven to provide some effects on residues after wet processings. For example, in a case when a specific metal is included in the electrolytes at a certain amount, the metal is liable to remain on a wafer after a wet processing. As to impurity of chemicals, hydrochloric acid records the highest purity while aqueous ammonia occupies a second position and chemicals formed as salts have comparatively poor purities. Among the electrolytes as recited above, ammonium fluoride, ammonium nitrate and ammonium chloride exhibit comparatively good purities. In view of this, detailed investigation has been concentrated on chemicals having comparatively good purities, and description will be focused thereon. The chemicals should be selected out of hydrochloric acid, aqueous ammonia, ammonium fluoride, ammonium nitrate, ammonium chloride etc. From the standpoints of the present chemical purities and the process steps applicable thereto. Those limitations are, however, not inherent to those chemicals by themselves, because other chemicals may be expected to provide similar treatment effects so long as purities of those chemicals are improved.

The preferable quantity of an electrolyte to be added to de-ionized water before electrolysis is proven to reside within a range between 0.08 and $2 \times 10^{-5}$ mol/l. The preferable upper limit of additive quantity is defined by an upper limit of electrolytic concentration wherein an electrolytic bath for low concentration use can pursue electrolysis. An improvement in equipment, however, may raise this upper limit. On the other hand, the preferable lower limit of electrolytic concentration is defined by stability in characteristics of electrolyzed waters. This lower limit can also be lowered by improvement in equipment and even a lower electrolytic concentration may exhibit an actual effect depending on species of processings.

As to ORP and pH values, a region wherein pH value exceeds 7 and ORP value stays less than −120 mV, and another region wherein pH value stays less than 7 and ORP value exceeds +700 mV exhibit considerably excellent effectiveness on processing semiconductive wafers. This fact is consistent with another fact that a remarkable characteristic nature of an electrolyzed- water induces significant difference in ORP values between them and other aqueous solutions obtained by mere addition of an electrolyte. Consequently, this other fact confirms, as experimentally verified, a next fact that electrolyzed waters. Whose ORP values stay between +600 mV and −120 mV around an ordinary value of +220 mV, do not exhibit a remarkable effect on processing semiconductive wafers.

Furthermore, oxoacid ions of about $10^{-3}$ mol/l detected in an electrolyzed water including chlorine, bromine and iodine are considered substances which provide specific characteristics of electrolyzed waters. Oxoacid ions iculde $ClO_x^-$, $BrO_x^-$, $IO_x^-$. This finding indicates that a large amount of oxoacid ions have a close relation to effective processings of semiconductor wafers.

Moreover, above embodiments are described as to solutions wherein $H_2O_2$ is added as an oxidizing additive, $O_3$-bubbling is adopted for enhancement of an oxidizing activity and hydrogen-bubbling is introduced for enhancement of a reducing activity, all of additives being added at least into either side of electrolyzed waters for providing a perturbation in characteristics of the electrolyzed waters. However, another solution wherein either $Cl_2$ or $Br_2$ gas is dissolved at a concentration ranging from $10^{-2}$ to $10^{-4}$ mol/l has also exhibited a similar effect and, addition of hydrofluoric acid at a concentration ranging from 0.1 to 0.001 mol/l, as described before, is also remarkably effective, especially if the processing is directed to removing the surface contaminants etc. in parallel with removing a natural oxide film.

Furthermore, addition of an adequate quantity of $H_2O_2$, $O_3$, $Cl_2$, $Br_2$, hydrogen or hydrofluoric acid into at least either side of the electrolyzed waters exhibits an excellent processing effects specific to the electrolyzed water when the addition is performed into either side of the electrolyzed waters which have been obtained by electrolysis of an even plain de-ionized water. Each of the lower limits and upper limits in residual quantities of $O_3$, $Cl_2$, $Br_2$ and $H_2$ gases as well as in additive quantities of $H_2O_2$, HF etc. corresponds to a minimum quantity wherein a specific effect for a semiconductor processing appears and a maximum quantity wherein any effect specific to the electrolyzed water cannot be obtained anymore while rendering an effect specific to electrolytic additives themselves dominant, respectively. To suppress the electrolyte and additive quantities in a low amount is preferable from the initial standpoint of reduction in chemical consumption. However, requirement for saving a processing time period makes the additive quantity approach the maximum limit. Even on that occasion, the maximum limit of additives is preferable to stay at 0.1 mol/l, which makes it understood that processings according to the present invention can reduce the consumption in chemicals remarkably as compared to the chemical consumption in the conventional processings.

It is shown that wet processings by use of electrolyzed active waters, limiting chemical consumption at most $8 \times 10^{-2}$ mol/l, have remarkable effects for removing surface particles, for removing a surface natural oxide film, for etching etc. which exhibit no lower level than that the conventional wet processings have.

Accordingly, concentrations of solute which have been used in strongly acidic and alkaline solutions or other ionic solutions of the conventional wet processings for manufacturing semiconductor devices can be remarkably reduced. It is quantitatively clarified that the chemical consumption can be reduced by more than one digit at least in most cases and more than four digits on specific cases as compared to the conventional, heavy chemical consumption, depending on species of processings. Although the amount of reduction in environmental load has not quantitatively been calculated, it is clear that a large load reduction for treatment of waste chemicals can be ensured even if an electric power consumption for applying voltages to water may be equivalent to a load for consumption of concentrated chemicals. Moreover, metallic contaminants of heavy metals accompanied with concentrated chemicals and being difficult to remove from solutions are also proven avoidable for a clean environment. Together with the advantages, unmeasurable effects can be attained in which securing safety for workers, dangers in transportation, and costs therefore can be reduced.

Furthermore, electrolyzed water even having almost neutral character, so far as obtained by electrolysis employing a minute amount of a supporting electrolyte, has a surface oxidizing activity or a surface reducing activity after it has lost the electrolyzation effect, which fact attracts a new scientific attention for processing procedures of semiconductor wafers.

What is claimed is:

1. A method for processing a semiconductor substrate comprising sequentially: a first step of adding at least one electrolyte selected from the group consisting of ammonium chloride, ammonium acetate, ammonium fluoride, ammonium nitrate, ammonium bromide, ammonium iodide, ammonium sulfate, ammonium oxalate, ammonium carbonate, ammonium citrate, ammonium formate, hydrochloric acid and aqueous ammonia into de-ionized water at a concentration ranging from $8 \times 10^{-2}$ to $2 \times 10^{-5}$ mol/l; and a second step of electrolyzing said de-ionized water to prepare at least one ionized water for processing a semiconductor substrate, and an additional step of contacting a semiconductor substrate with said at least one ionized water.

2. A method for processing a semiconductor substrate as defined in claim 1, further comprising a third step of adding at least one acid selected from the group consisting of chelating agents, hydrochloric acid, formic acid and nitric acid at a concentration ranging from $10^{-2}$ to $10^{-4}$ mol/l into said de-ionized water.

3. A method for processing a semiconductor substrate as defined in claim 2, further comprising a fourth step of bubbling said ionized water with at least one gas selected from the group consisting of $Cl_2$, $Br_2$, $I_2$ and $O_3$.

4. A method for processing a semiconductor substrate as defined in claim 1, wherein said at least one ionized water is an anode water, and further comprising a third step of adding at least one chemical selected from group consisting of hydrofluoric acid and ammonium fluoride at a concentration ranging from $10^{-1}$ to $10^{-3}$ mol/l into said anode water.

5. A method for processing a semiconductor substrate as defined in claim 4, further comprising a fourth step of bubbling said anode water with at least one gas selected from the group consisting of $Cl_2$, $Br_2$, $I_2$ or $O_3$.

6. A method for processing a semiconductor substrate as defined in claim 1, wherein said at least one ionized water is a cathode water, and further comprising a third step of adding at least one acid selected from the group consisting of sulfuric acid and phosphoric acid into said cathode water at a molar concentration ranging from 1/10 to 1/500 of the molar concentration of said electrolyte added.

7. A method for processing a semiconductor substrate as defined in claim 6, further comprising a fourth step of bubbling said ionized water with $H_2$ gas.

8. A method for processing a semiconductor substrate as defined in claim 1, wherein said at least one ionized water is a cathode water, and further comprising a third step of adding $H_2O_2$ into said cathode water at a molar concentration ranging between the molar concentration of said electrolyte as added and 1/10 thereof.

9. A method for processing a semiconductor substrate as defined in claim 8, further comprising a fourth step of bubbling said cathode water with $H_2$ gas.

10. A method for processing a semiconductor substrate comprising sequentially a first step of electrolyzing deionized water to prepare an anode water; and a second step of adding at least one acid selected from the group consisting of chelating agent, hydrochloric acid, formic acid and nitric acid at a concentration ranging from $10^{-2}$ to $10^{-4}$ mol/l into said anode water to provide a processing solution for processing a semiconductor substrate.

11. A method for processing a semiconductor substrate as defined in claim 10, further comprising a third step of bubbling said ionized water with at least one gas selected from the group consisting of $Cl_2$, $Br_2$, $I_2$ and $O_3$.

12. A method for processing a semiconductor substrate as defined in claim 1, wherein said at least one ionized water is an anode water, and further comprising a third step of bubbling said anode water with at least one gas selected from a group consisting of $Cl_2$, $Br_2$, $I_2$ and $O_3$.

13. A method for processing a semiconductor substrate as defined in claim 1, wherein said at least one ionized water is a cathode water, and further comprising a third step of bubbling said cathode water with $H_2$ gas.

* * * * *